(12) United States Patent
Kitani et al.

(10) Patent No.: US 9,592,986 B2
(45) Date of Patent: Mar. 14, 2017

(54) COMPONENT SUPPLYING APPARATUS AND COMPONENT SUPPLYING METHOD

(71) Applicant: Panasonic Corporation, Osaka (JP)

(72) Inventors: Minoru Kitani, Osaka (JP); Kazunori Kanai, Yamanashi (JP); Kazuo Kido, Hyogo (JP); Seikou Abe, Osaka (JP); Motohiro Higuchi, Nara (JP); Shigeru Matsukawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 161 days.

(21) Appl. No.: 14/322,059

(22) Filed: Jul. 2, 2014

(65) Prior Publication Data

US 2015/0034692 A1     Feb. 5, 2015

(30) Foreign Application Priority Data

Jul. 31, 2013   (JP) ................................ 2013-159353
Feb. 21, 2014  (JP) ................................ 2014-031855

(51) Int. Cl.
    *B65H 20/20*    (2006.01)
(52) U.S. Cl.
    CPC ..... *B65H 20/20* (2013.01); *B65H 2301/4421* (2013.01); *B65H 2301/44514* (2013.01); *B65H 2301/44516* (2013.01); *B65H 2404/623* (2013.01); *B65H 2404/722* (2013.01); *B65H 2404/725* (2013.01)
(58) Field of Classification Search
    CPC .............. B65H 20/20; B65H 2404/623; B65H 2404/722; B65H 2404/725; B65H 9/06; B65H 9/101; B65H 2301/44516

USPC ...................................... 226/64, 70; 271/246
See application file for complete search history.

(56) References Cited

U.S. PATENT DOCUMENTS 5,253,861 A * 10/1993 Schmaling ............... B65H 9/06
                                                            271/209
2011/0243695 A1  10/2011  Hwang et al.

FOREIGN PATENT DOCUMENTS

| JP | 2011-171664 | 9/2011 |
| JP | 2011-211169 | 10/2011 |
| JP | 2014-27129 | 2/2014 |

* cited by examiner

*Primary Examiner* — Michael McCullough
(74) *Attorney, Agent, or Firm* — Wenderoth, Lind & Ponack, L.L.P.

(57) ABSTRACT

A component supplying apparatus comprises a tape guide surface facing a lower surface of the carrier tape, a preceding tape contact part climbing onto a upper surface of the preceding carrier tape, and a subsequent tape blocking part configured to wait on the upstream side of the preceding tape contact part in a tape feeding direction while keeping a distance from the tape guide surface so as to enable the carrier tape to pass between the subsequent tape blocking part and the tape guide surface, and to move downwardly toward the preceding carrier tape when the preceding tape contact part is climbed onto the preceding carrier tape. The subsequent tape blocking part keeps the subsequent carrier tape waiting by contacting a front end of the subsequent carrier tape stacked on the preceding carrier tape onto which the preceding tape contact part climbs.

10 Claims, 14 Drawing Sheets

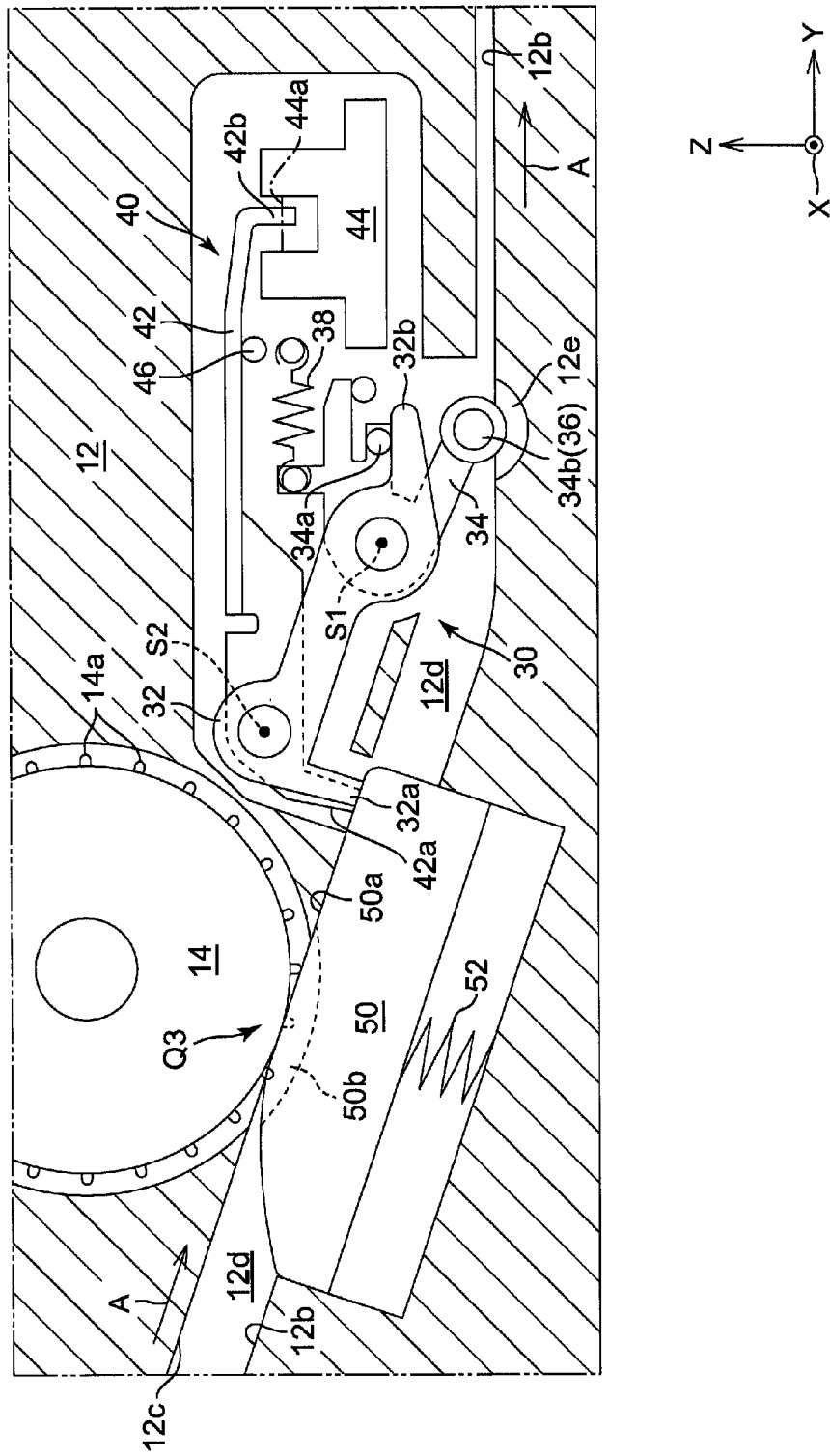

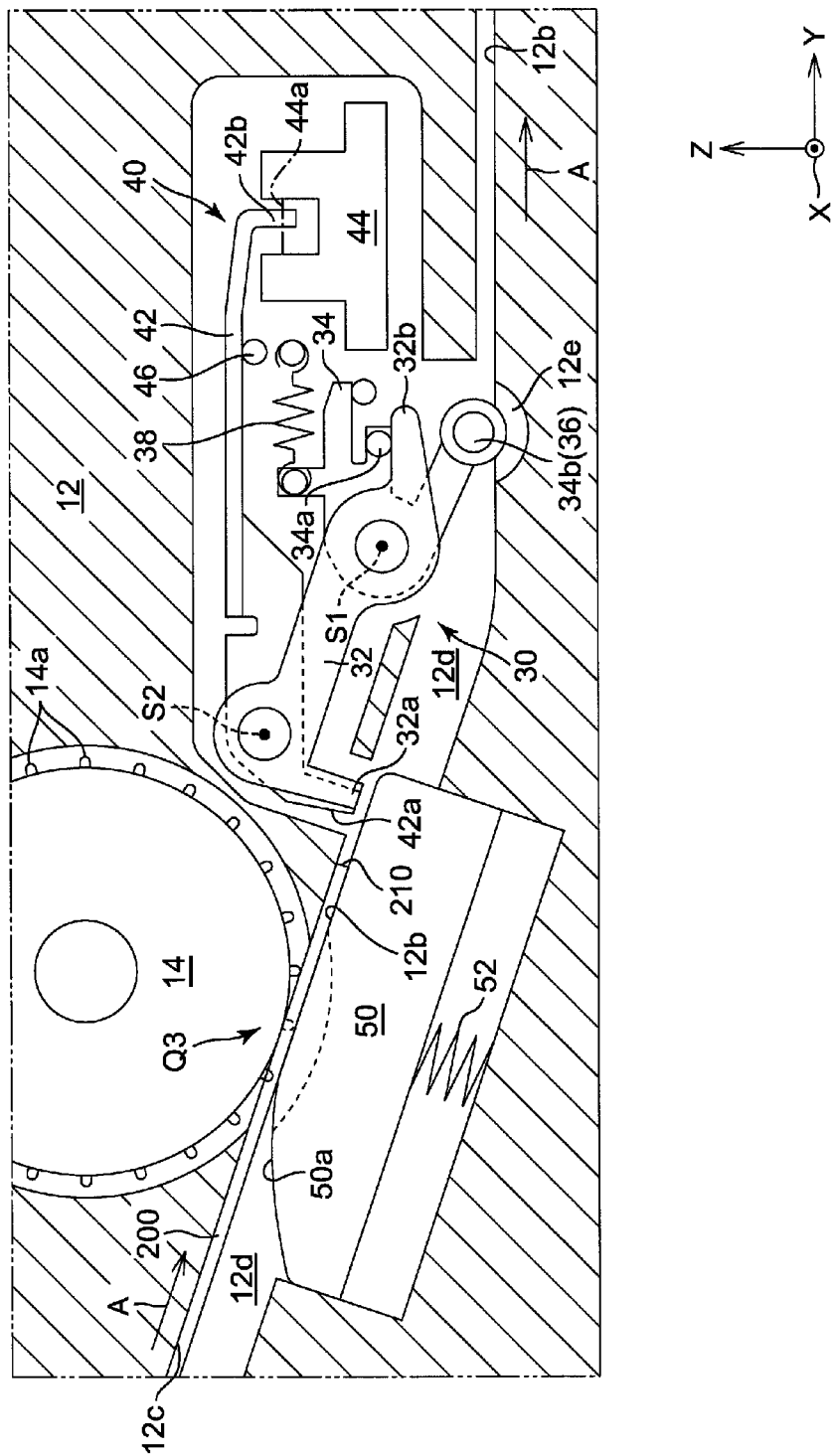

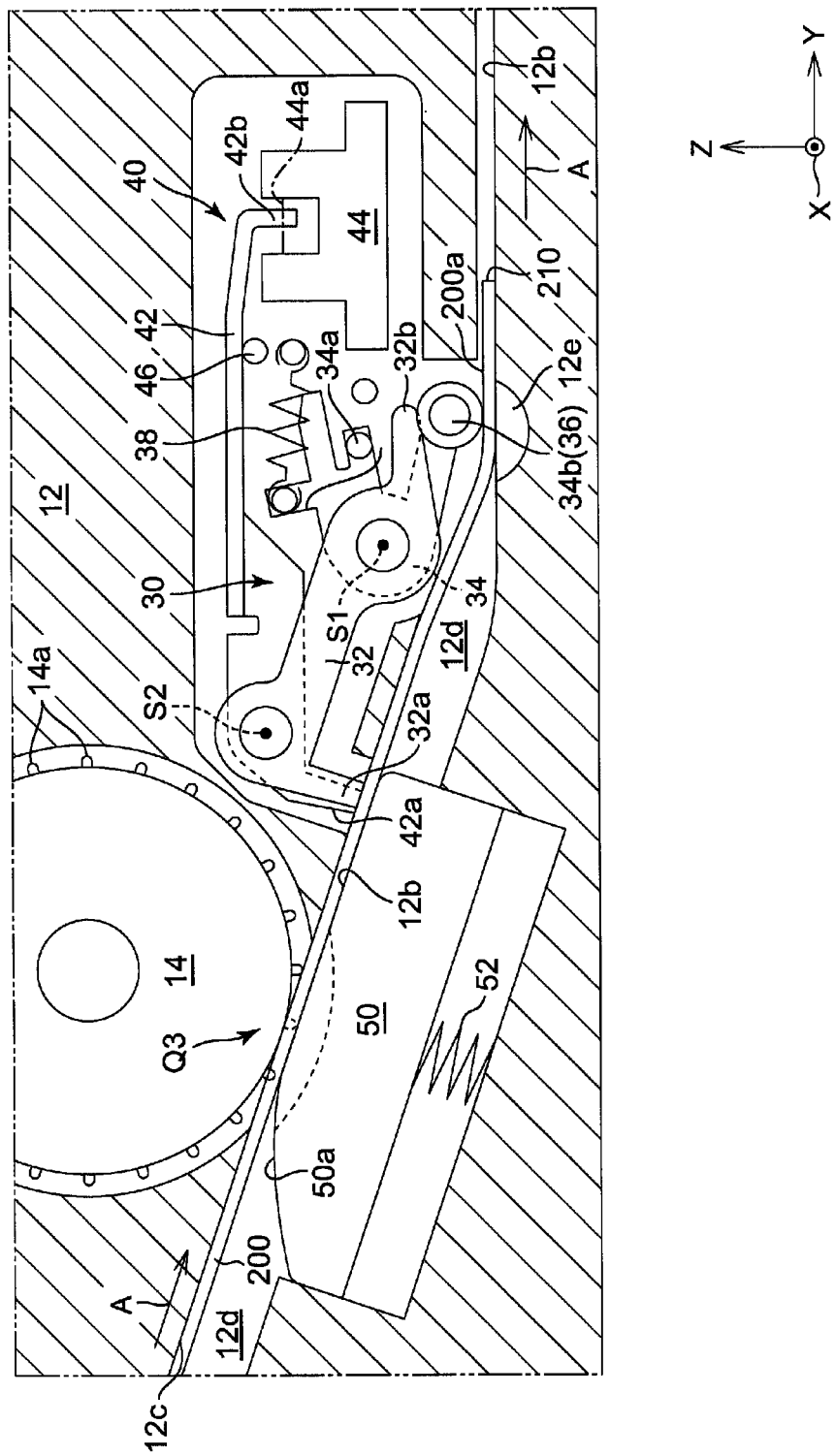

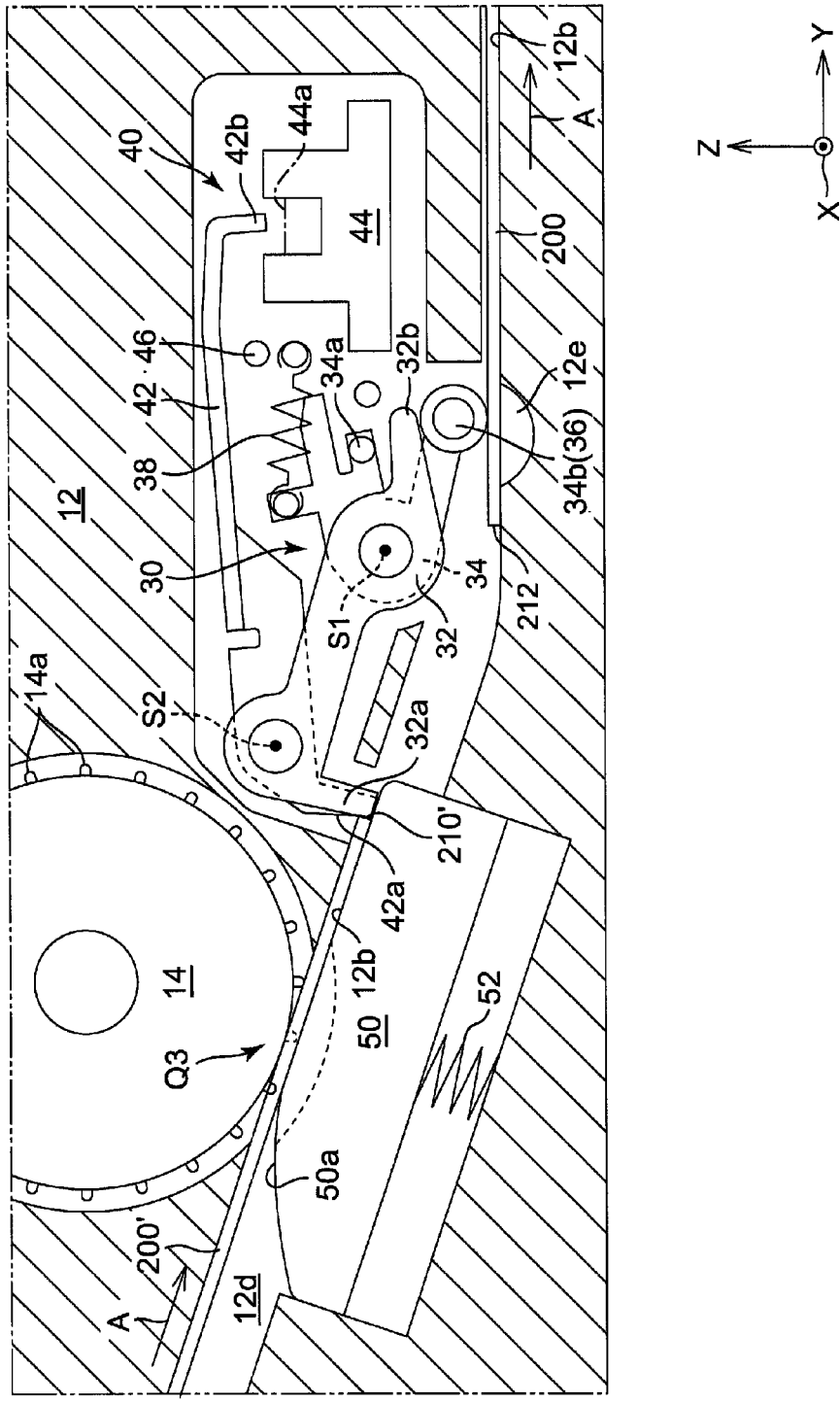

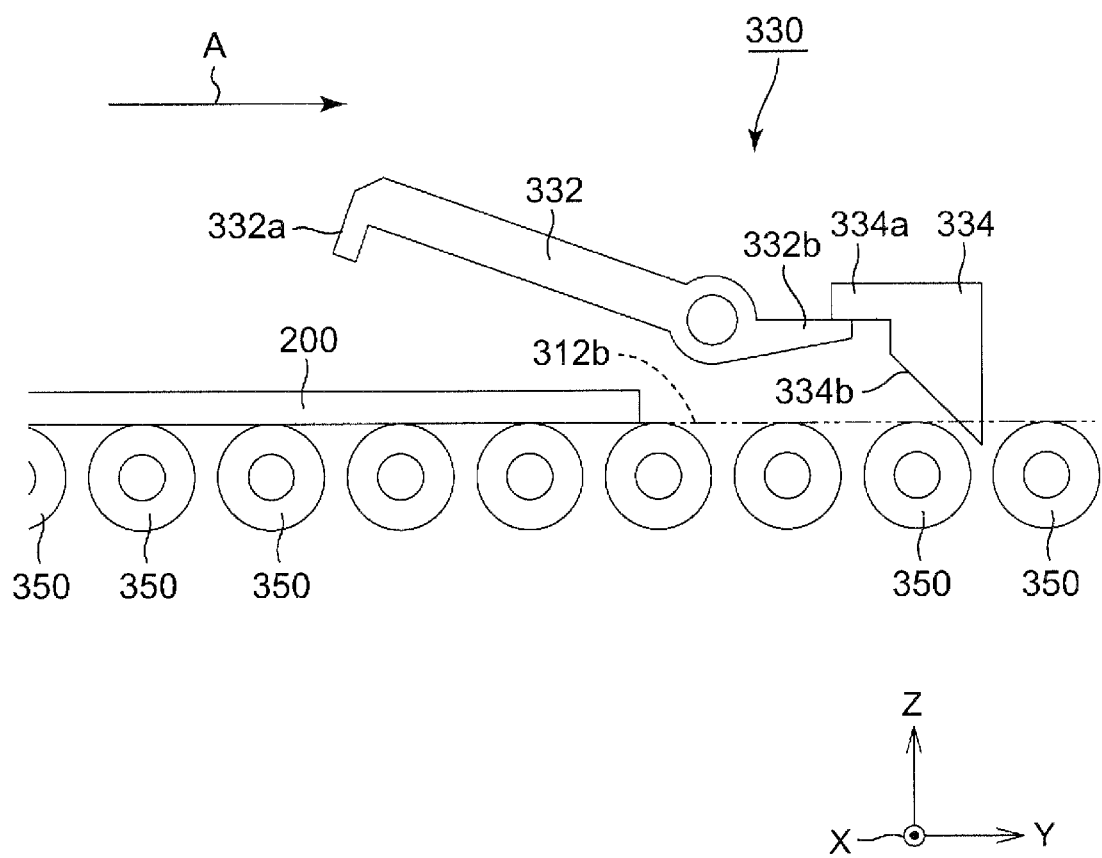

COMPONENT SUPPLYING APPARATUS AND COMPONENT SUPPLYING METHOD

CROSS-REFERENCE TO RELATED APPLICATIONS

This application is an application claiming priorities to Japanese Patent Applications Nos. 2013-159353 and 2014-031855, these contents of which are incorporated herein by reference.

TECHNICAL FIELD

The present invention relates to a component supplying apparatus and a component supplying method for supplying components onto nozzles of a transfer head of a component mounting apparatus.

BACKGROUND ART

Conventionally, a carrier tape has been used for supplying components onto nozzles of a transfer head of a component mounting apparatus. The carrier tape includes a base tape in which a plurality of depressed or embossed component recesses for accommodating components are arranged in a tape longitudinal direction and a top tape which is pasted on the base tape so as to cover the plurality of component recesses having the components accommodated therein. The top tape is removed from the base tape so that the components in the component recesses of the carrier tape can be sucked by the nozzles of the transfer head of the component mounting apparatus.

Japanese Laid-Open Patent Publication (JP) 2011-211169A discloses that the removing of the top tape from the base tape is carried out with use of a blade having an edge, for instance. Specifically, the blade is placed on a tape path of the carrier tape that is fed in the tape longitudinal direction. The edge of the blade enters between the base tape and the top tape in the tape longitudinal direction from front end side of the carrier tape that is moving, and the top tape is thereby removed from the base tape. A component supplying apparatus disclosed in Patent document 1 is configured so as to remove from the base tape a portion of the top tape on one side of the tape width direction.

The component supplying apparatus disclosed in JP 2011-211169A is configured to serially and automatically feed a plurality of carrier tapes in a tape feeding direction. Specifically, the plurality of carrier tapes are serially fed such that a front end of a subsequent carrier tape runs after a rear end of a preceding carrier tape.

Also, the component supplying apparatus disclosed in JP 2011-211169A is configured to keep the subsequent carrier tape waiting until a start timing of a feed thereof with the subsequent carrier tape stacked on the preceding carrier tape fed in the tape feeding direction.

Specifically, the preceding carrier tape is fed in the tape feeding direction along a tape guide surface of a tape guiding part and is pressed toward the tape guiding part by a pad positioned above the preceding carrier tape. In other words, the preceding carrier tape is fed in the tape feeding direction and is wedged between the tape guide surface of the tape guiding part and the pad.

On the other hand, the subsequent carrier tape is stacked on the preceding carrier tape fed in the tape feeding direction, a front end thereof contacts with the pad, and thus the subsequent carrier tape waits.

After the rear end of the preceding carrier tape has passed the front end of the subsequent carrier tape (that is, an overlap of tapes is lost), the subsequent carrier tape enter into a gap between the tape guide surface of the tape guiding part and the pad. The gap is resulted from an interposition of the rear end of the preceding carrier tape between the tape guide surface of the tape guiding part and the pad. Consequently, the subsequent carrier tape is fed in the tape feeding direction in the wake of the preceding carrier tape.

However, in the component supplying apparatus disclosed in JP 2011-211169A, a thin carrier tape is likely to fail a wedging thereof between the tape guide surface of the tape guiding part and the pad when there is no carrier tape therebetween. In the case where the preceding carrier tape is a relatively-thin and the subsequent carrier tape is a relatively-thick, the thick subsequent carrier tape is likely to fail a wedging into a narrow gap between the tape guide surface of the tape guiding part and the pad when the rear end of the thin preceding carrier tape lying therebetween. Therefore, it is difficult to reliably serially-feed the plurality of carrier tapes.

SUMMARY OF THE INVENTION

It is an object of the invention to reliably serially-feed a plurality of carrier tapes regardless of the carrier tape thicknesses.

In order to achieve the above object, according to a first aspect of present invention, a component supplying apparatus is provided for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying apparatus comprising:

a tape guiding part having a tape guide surface facing a lower surface of the carrier tape and guiding the carrier tape so as to make the carrier tape move along a tape path, a preceding tape contact part capable to climb onto a upper surface of the preceding carrier tape by coming into contact with the preceding tape moving in the tape feeding direction along the tape guide surface of the tape guiding part, and a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part is climbed onto the upper surface of the preceding carrier tape, and to move upwardly from the preceding carrier tape toward the waiting position when the preceding tape contact part is climbed down from the upper surface of the preceding carrier tape, wherein the subsequent tape blocking part keeps the subsequent carrier tape waiting by contacting a front end of the subsequent carrier tape stacked on the preceding carrier tape onto which the preceding tape contact part climbs.

According to a second aspect, there is provided the component supplying apparatus of the first aspect, further comprising:

a swingable stopper part having free ends positioned upstream and downstream sides of the swinging center thereof in the tape feeding direction, and further having the subsequent tape blocking part on the upstream free end side, and a movable locking part having the preceding tape contact part and a stopper contact part locking the subsequent tape blocking part of the stopper part at the waiting position by coming into contact with the downstream free end side of the stopper part from at least above, wherein the locking part moves by the climbing of the preceding tape contact part of the locking part onto the upper surface of the preceding carrier tape moving in the tape feeding direction, thereby the stopper contact part of the locking part moves away from the stopper part so as to unlock the subsequent tape blocking part of the stopper part, consequently, the stopper part swings until the subsequent tape blocking part thereof comes into contact with the upper surface of the preceding carrier tape.

According to a third aspect, there is provided the component supplying apparatus of the second aspect, wherein the stopper part is configured such that the subsequent tape blocking part thereof moves downwardly by use of the weight thereof toward the upper surface of the preceding carrier tape when the stopper contact part of the locking part moves away from the stopper part.

According to a fourth aspect, there is provided the component supplying apparatus of the second aspect, wherein the locking part is capable to swing and has two free ends, the stopper contact part is provided on the one free end side, and the preceding tape contact part is provided on the other free end.

According to a fifth aspect, there is provided the component supplying apparatus of the fourth aspect, wherein the swinging center of the stopper part is coincident with a swinging center of the locking part.

According to a sixth aspect, there is provided the component supplying apparatus of the first aspect, further comprising a swingable lever part having free ends positioned upstream and downstream sides of the swinging center thereof in the tape feeding direction, further having the subsequent tape blocking part on the upstream free end side, and having the preceding tape contact part on the downstream free end side.

According to a seventh aspect, there is provided the component supplying apparatus of the first aspect, wherein the tape guide surface of the tape guiding part have a concave portion in which at least part of the preceding tape contact part enters from above, and the preceding tape contact part is configured to climb onto the upper surface of the preceding carrier tape moving in tape feeding direction along the tape guide surface of the tape guiding part from the concave portion of the tape guide surface thereof.

According to an eighth aspect, there is provided the component supplying apparatus of the seventh aspect, wherein the carrier tape has embossed parts protruding from the lower surface, and the concave portion of the tape guiding part is a groove which extends in the tape feeding direction and in which the embossed parts of the carrier tape are movable.

According to a ninth aspect, there is provided the component supplying apparatus of the first aspect, wherein the preceding tape contact part is a roller rotating freely about a center line of a rotation extending in a tape widthwise direction.

According to a tenth aspect, there is provided the component supplying apparatus of the first aspect, further comprising a subsequent tape detection part detecting the subsequent carrier tape with a front end thereof in the tape feeding direction contacted with the subsequent tape blocking part, the subsequent tape detection part comprises a swingable probe part and a sensor, the probe part has free ends positioned on upstream and downstream sides of the swinging center thereof in the tape feeding direction, and further has a subsequent tape contact part provided on the upstream free end side and a detective target part provided on the downstream free end side, the subsequent tape contact part is configured to come into contact with the front end of the subsequent carrier tape moving in the tape feeding direction on the preceding carrier tape before the subsequent tape blocking part comes into contact with the subsequent carrier tape, and the sensor detects a movements of the detective target part of the probe part.

According to an eleventh aspect, there is provided the component supplying apparatus of the tenth aspect, wherein the probe part of the subsequent tape detection part is configured such that a distance between the swinging center of the probe part and the detective target part is longer than a distance between the swinging center and the subsequent tape contact part.

According to an twelfth aspect, there is provided a component supplying method for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying method comprising:

preparing:
  a tape guiding part having a tape guide surface facing a lower surface of the carrier tape and guiding the carrier tape so as to make the carrier tape move along a tape path,
  a preceding tape contact part capable to climb onto a upper surface of the preceding carrier tape by coming into contact with the preceding tape moving in the tape feeding direction along the tape guide surface of the tape guiding part, and
  a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part is climbed onto the upper surface of the preceding carrier tape, and to move upwardly from the preceding carrier tape toward the waiting position when the preceding tape contact part is climbed down from the upper surface of the preceding carrier tape, feeding the preceding carrier tape in the tape feeding direction along the tape guide surface such that the preceding tape contact part is climbed onto the upper surface of the preceding carrier tape and thereby the subsequent tape blocking part moves downwardly toward the upper surface of the preceding carrier tape, and feeding the subsequent carrier tape in the tape feeding direction along the upper surface of the preceding carrier tape onto which the preceding tape contact part has been climbed until a front end of the subsequent carrier tape comes into contact with the subsequent tape blocking part on the preceding carrier tape.

According to the invention, a plurality of carrier tapes are reliably serially-fed regardless of the carrier tape thicknesses.

BRIEF DESCRIPTION OF DRAWINGS

FIG. 4A is a fragmentary enlarged view of the component supplying apparatus in accordance with the first embodiment, including the vicinity of the subsequent tape standby position tape right before entering the preceding carrier tape into the apparatus;

FIG. 4B is a fragmentary enlarged view of the component supplying apparatus in accordance with the first embodiment, including the vicinity of the subsequent tape standby position right before a front end of the preceding carrier tape passes under a subsequent tape blocking part of a stopper part of a subsequent tape blocking device;

FIG. 4C is a fragmentary enlarged view of the component supplying apparatus in accordance with the first embodiment, including the vicinity of the subsequent tape standby position right after the preceding carrier tape comes into contact with a preceding tape contact part of a locking part of the subsequent tape blocking device;

FIG. 4E is a fragmentary enlarged view of the component supplying apparatus in accordance with the first embodiment, including the vicinity of the subsequent tape standby position right after a rear end of the preceding carrier tape passes under the subsequent tape blocking part of the stopper part of the subsequent tape blocking device;

FIG. 8 is a schematic view for showing a subsequent tape blocking device and a tape guide surface in a component supplying apparatus in accordance with a further another embodiment.

DETAILED DESCRIPTION OF INVENTION

Hereinbelow, embodiments of the invention will be described with reference to the drawings.

First Embodiment

Figure 1:
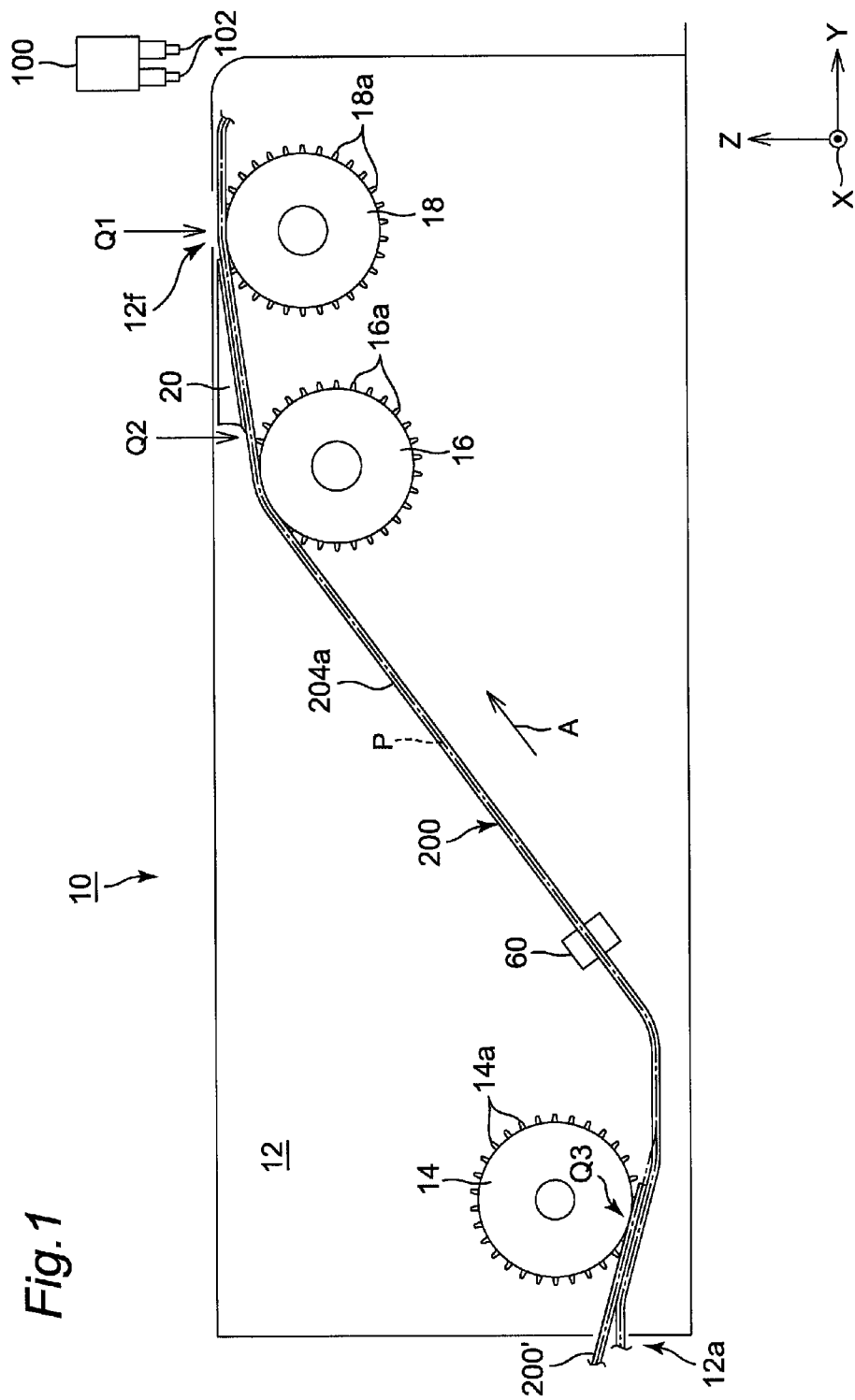
FIG. 1 shows a schematic configuration of a component supplying apparatus in accordance with a first embodiment of the invention.

FIG. 1 schematically shows a configuration of a component supplying apparatus in accordance with a first embodiment of the invention.

The component supplying apparatus 10 in accordance with the first embodiment is configured so as to supply components onto nozzles 102 of a transfer head 100 of a component mounting apparatus. Specifically, the component supplying apparatus 10 supplies components onto the nozzles 102 of the transfer head 100 with use of a carrier tape 200 accommodating the components as shown in FIG. 2.

Figure 2:
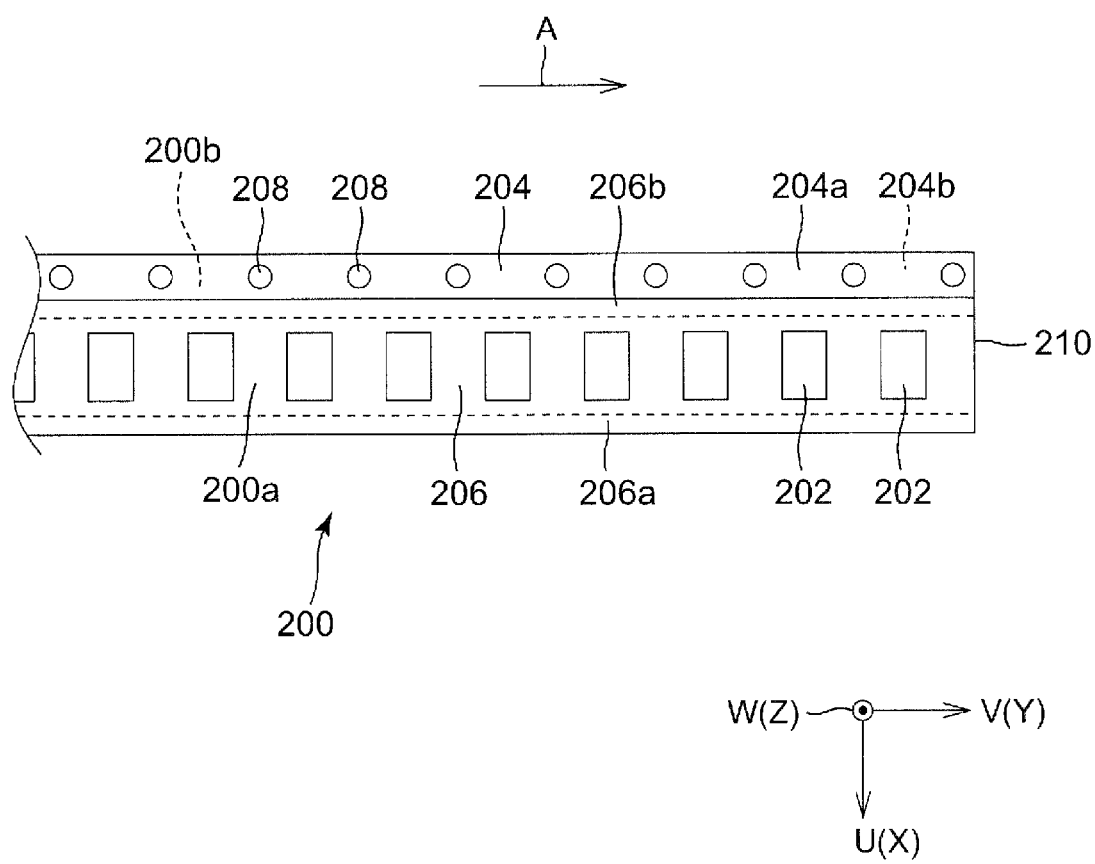
FIG. 2 is a view of a carrier tape as seen in tape thickness direction.

FIG. 2 shows a front end side portion (end side portion that resides on front side when the tape is moving) of the carrier tape 200. In a rectangular coordinate system u-v-w shown in FIG. 2, u-axis direction corresponds to tape width direction, v-axis direction corresponds to tape longitudinal direction, and w-axis direction corresponds to tape thickness direction.

As shown in FIG. 2, the carrier tape 200 has a base tape 204 having a plurality of component recesses 202 accommodating the components, which supplied onto the nozzles 102 of the transfer head 100 of the component mounting apparatus, and arranged in the tape longitudinal direction (v-axis direction), and a top tape 206 pasted on the base tape 204 through both end sides thereof in the tape width direction (u-axis direction) so that the top tape 206 covers the component recesses 202. The carrier tape 200 has a plurality of feed holes 208 formed on the base tape 204, arranged in the tape longitudinal direction, and penetrates in the tape thickness direction (w-axis direction).

As shown in FIG. 2, the top tape 206 is pasted with adhesive or the like on a portion of a main surface 204a of the base tape 204 excluding a portion thereof where the feed holes 208 are formed. Specifically, both end portions 206a, 206b of the top tape 206 excluding the center portion (portion covering the component recesses 202) in the tape width direction (u-axis direction) are pasted on the main surface 204a of the base tape 204.

Returning to FIG. 1, the component supplying apparatus 10 has a body part 12, a tape path P formed in the body part 12, a plurality of sprocket wheels 14-18 for feeding the carrier tape 200 in the tape longitudinal direction along the tape path P, and a blade 20 for removing the top tape 206 from the base tape 204.

A tape entering port 12a for entering the carrier tape 200 into the body part 12 is provided at start end (upstream end in a tape feeding direction A) of the tape path P in the body part 12 of the component supplying apparatus 10. The carrier tape 200 is entered into the tape entering port 12a in the tape longitudinal direction in a state in which the main surface 204a of the base tape 204 having the top tape 206 pasted thereon faces upward.

The component supplying apparatus 10 has a component supply port 12f placed above the tape path P so that the nozzles 102 of the transfer head 100 of the component mounting apparatus can suck the components, therethrough from above, in the component recesses 202 of the carrier tape 200 from which the top tape 206 has been removed by the blade 20. That is, the component supply port 12f is provided at a component supply position Q1 where the nozzles 102 of the transfer head 100 suck components.

The plurality of sprocket wheels 14-18 are provided in the tape path P in order to feed the carrier tape 200 along the tape path P in the tape feeding direction A that is the tape longitudinal direction. The plurality of sprocket wheels 14-18 rotate with teeth 14a-18a engaging with the feed holes 208 of the carrier tape 200 and thereby feed the carrier tape 200 along the tape path P in the tape feeding direction A toward the component supply port 12f (the component supply position Q1).

The blade 20 partially removes the top tape 206 from the base tape 204 at a top tape removing position Q2 on the upstream side of the component supply position Q1 in the tape feeding direction A so that the nozzles 102 of the transfer head 100 can suck the components at the component supply position Q1.

Specifically, at the top tape removing position Q2, an edge of the blade 20 relatively enters between the base tape 204 and the top tape 206 from front end 210 side of the carrier tape 200 fed in the tape feeding direction A by the sprocket wheel 16. The carrier tape 200 is fed in the tape feeding direction A with the edge of the blade 20 entering between the base tape 204 and the top tape 206 and thereby the top tape 206 is removed from the base tape 204. For example, the blade 20 removes one side portion 206a of the top tape 206, which is a further side portion of the feed holes 208, from the base tape 204 such that the component recesses 202 are exposed. After the blade 20 partially removes the top tape 206, the nozzles 102 of the transfer head 100 of the component mounting apparatus can suck components in the component recesses 202 at the component supply position Q1 on the downstream side of the top tape removing position Q2 in the tape feeding direction A. The blade 20 may be a blade removing the entire top tape 206 from the base tape 204.

The component supplying apparatus 10 is configured to serially-feed a plurality of the carrier tapes 200 in the tape feeding direction A toward the component supply position Q1. Specifically, the plurality of carrier tapes 200 are serially fed such that a front end of a subsequent carrier tape 200 runs after a rear end of a preceding carrier tape 200.

Hereinbelow, in order to clarify the difference between the preceding carrier tape 200 and the subsequent carrier tape 200, apostrophes are added to numerical references associated with the subsequent carrier tape.

As shown in FIG. 1, the component supplying apparatus 10 is configured to keep the subsequent carrier tape 200' waiting until the start timing of the feed thereof with the subsequent carrier tape 200' stacked on the preceding carrier tape.

Figure 3:
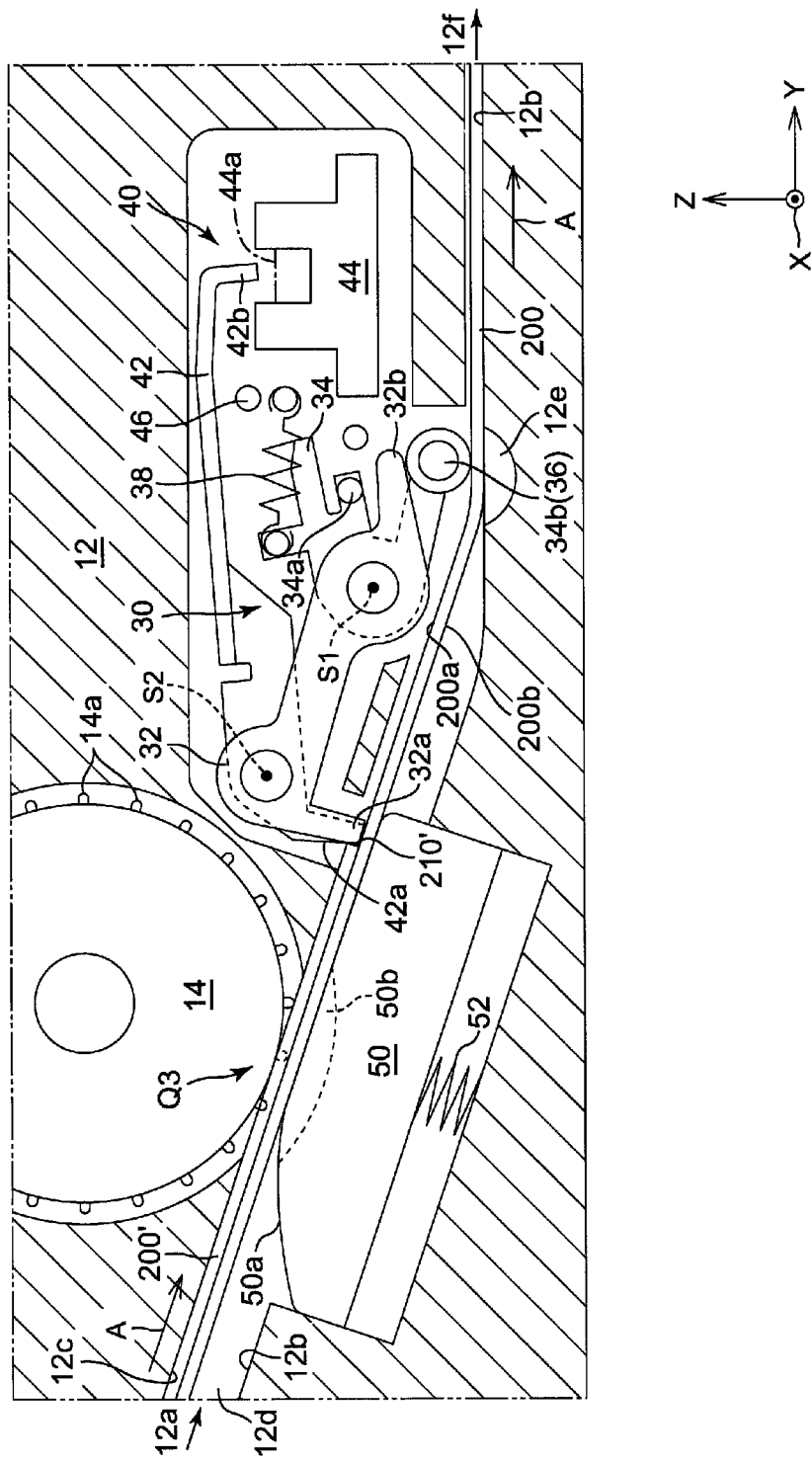
FIG. 3 is a fragmentary enlarged view of the component supplying apparatus in accordance with the first embodiment, including a vicinity of a subsequent tape standby position at which a subsequent carrier tape stacked on a preceding carrier tape waits.

FIG. 3 is a fragmentary enlarged view of the component supplying apparatus 10 including a vicinity of a subsequent tape standby position Q3 at which the subsequent carrier tape 200' waits until the start timing of the feed thereof.

As shown in FIG. 3, the subsequent carrier tape 200' is entered into tape entering port 12a, and then waits with the subsequent carrier tape 200' stacked on an upper surface 200a of the preceding carrier tape 200 fed in the tape feeding direction A. The subsequent carrier tape 200' also waits with the feed holes 208' thereof engaging with the teeth 14a of the sprocket wheel 14 positioned on the upstream side of the tape feeding direction A. That is, the subsequent tape standby position Q3 at which the subsequent carrier tape 200' waits is a position at which the feed holes 208' thereof can engage with the teeth 14a of the sprocket wheel 14.

When the subsequent carrier tape 200' waits with the feed holes 208' thereof engaged with the teeth 14a of the sprocket wheel 14, the preceding carrier tape 200, which is under the subsequent carrier tape 200' and fed in the tape feeding direction A toward the component supply position Q1, does not engage with the sprocket wheel 14. The sprocket wheel 14, which engaging with the subsequent carrier tape 200' in the waiting state, is suspended in rotation (i.e., tape feed) until a waiting of the subsequent carrier tape 200' is finished. At the start timing of the feed of the subsequent carrier tape 200', the sprocket wheel 14 starts to rotate and thereby feed the subsequent carrier tape 200'.

As shown in FIG. 3, a movement of the subsequent carrier tape 200' in the tape feeding direction A is blocked by a subsequent tape blocking device 30 so as to keep the subsequent carrier tape 200' waiting with it stacked on the preceding carrier tape 200 fed in the tape feeding direction A. That is, the subsequent tape blocking device 30 prevents the subsequent carrier tape 200' from moving in the tape feeding direction A by riding the preceding carrier tape 200. Hereinbelow, configurations of the subsequent tape blocking device 30 and the associated elements of the component supplying apparatus will be described with reference to FIGS. 3, and 4A-4F.

As shown in FIG. 3, the subsequent tape blocking device 30 comprises a stopper part 32 contacting with the subsequent carrier tape 200' on the preceding carrier tape 200 and thus blocking the movement of the subsequent carrier tape 200' in the tape feeding direction A, and a locking part 34 releasably locking the stopper part 32.

The preceding and subsequent carrier tapes 200, 200' pass through a tape guiding part 12d that is a space between a lower tape guide surface 12b and an upper tape guide surface 12c formed in the body part 12 of the component supplying apparatus 10, and consequently are guided so as to move in the tape feeding direction A along the tape path P shown in FIG. 1. The subsequent tape blocking device 30 is disposed above the tape guiding part 12 and on the downstream side of the sprocket wheel 14 in the tape feeding direction A. The lower tape guide surface 12b of the tape guiding part 12d faces a lower surface 200b of the carrier tape 200 and the upper tape guide surface 12c faces the upper surface 200a of the carrier tape 200 (i,e., the main surface 204a of the base tape 204 on which the top tape 206 is pasted).

In the first embodiment, the stopper part 32 of the subsequent tape blocking device 30 is a member able to swing about a center line of swinging S1 extending in the tape width direction (X-axis direction) of the carrier tape 200 fed in the tape feeding direction A on the lower tape guide surface 12b of the tape guiding part 12d. For example, the stopper part 32 is supported swingably by a support pin (not shown) provided in the body part 12 of the component supplying apparatus 10 and extending in the X-axis direction. Also, the stopper part 32 has a free end positioned on the upstream side of the center line of swinging S1 in the tape feeding direction A and a free end positioned on the downstream side of the center line S2 in the tape feeding direction A. Further, the stopper part 32 has a subsequent tape blocking part 32a on the upstream free end side and an engagement part 32b on the downstream free end side.

The subsequent tape blocking part 32a of the stopper part 32 in the subsequent tape blocking device 30, as shown in FIG. 3, contacts with a front end 210' of the subsequent carrier tape 200' stacked on the preceding carrier tape 200 and thus blocks the movement of the subsequent carrier tape 200' in the tape feeding direction A. By using the subsequent tape blocking part 32a, the subsequent carrier tape 200' can wait at the subsequent tape standby position Q3 with it stacked on the preceding carrier tape 200.

As shown in FIG. 3, when the subsequent tape blocking part 32a of the stopper part 32 of the subsequent tape blocking device 30 contacts with the front end 210' of the subsequent carrier tape 200', the subsequent tape blocking part 32a contacts with the upper surface 200a of the preceding carrier tape 200. In the first embodiment, by use of the weight of the subsequent tape blocking part 32a, the subsequent tape blocking part 32a moves downwardly toward the upper surface 200a of the preceding carrier tape 200, then comes into contact with it, and keeps on contacting it. That is, when the stopper part 32 is not locked by the locking part 34 and thus can swing freely as described below in detail, the stopper part 32 is configured such that the subsequent tape blocking part 32a can move downwardly. Therefore, a thin subsequent carrier tape 200' is suppressed from passing between the subsequent tape blocking part 32a and the upper surface 200a of the preceding carrier tape 200.

The engagement part 32b of the stopper part 32 of the subsequent tape blocking device 30, as described below in detail, is a part contacting with the locking part 34 when stopper part 32 is locked by the locking part 34.

The component supplying apparatus 10 may comprises a subsequent tape detection device 40 for detecting the subsequent carrier tape 200' waiting at the subsequent tape standby position Q3.

The subsequent tape detection device 40 is configured to detect the subsequent carrier tape 200' waiting at the subsequent tape standby position Q3, i.e., with the front end 210' thereof contacting with the subsequent tape blocking part 32a of the stopper part 32 of the subsequent tape blocking device 30. The subsequent tape detection device 40 has a probe part 42 coming into contact with the front end 210' of the subsequent carrier tape 200' stacked on the preceding carrier tape 200, and a sensor 44 detecting a movement of the probe part 42 caused by a contact with the subsequent carrier tape 200'.

The probe part 42 of the subsequent tape detection device 40 is supported swingably by the stopper part 32 of the subsequent tape blocking device 30 and swings about a center line of swinging S2 provided on the upstream free end side of the stopper part 32 of the subsequent tape blocking device 30 and extending in the tape width direction (the X-axis direction). For example, the probe part 42 is supported swingably by a support pin (not shown) provided on the upstream free end side of the stopper part 32 and extending in the tape width direction (the X-axis direction).

The probe part 42 of the subsequent tape detection device 40 has a free end on the upstream side of the center line of swinging S2 in the tape feeding direction A, and a free end on the downstream side of the center line S2. Also, the probe part 42 has a subsequent tape contact part 42a positioned on the upstream free end side and coming into contact with the front end 210' of the subsequent carrier tape 200', and a detective target part 42b positioned on the downstream free end side and detected by the sensor 44.

The subsequent tape contact part 42a of the probe part 42 of the subsequent tape detection device 40 is configured to come into contact with the front end 210' of the subsequent carrier tape 200' before the subsequent tape blocking part 32a of the stopper part 32 of the subsequent tape blocking device 30 comes into contact with the front end 210' of the subsequent carrier tape 200'. This will be described with reference to FIGS. 3, 4A, and 4B.

FIG. 4A is a fragmentary enlarged view of the component supplying apparatus 10 showing the vicinity of the subsequent tape standby position Q3 right before the preceding carrier tape 200 enters into the body part 12 of the component supplying apparatus 10. FIG. 4B is a fragmentary enlarged view of the component supplying apparatus 10 showing the vincinity of the subsequent tape standby position Q3 right before the front end 210 of the preceding carrier tape 200 passes under a subsequent tape blocking part 32a of a stopper part 32 of a subsequent tape blocking device 30.

FIGS. 4A and 4B also show that the front end 210' of the subsequent carrier tape 200' does not contact with the subsequent tape blocking part 32a of the stopper part 32 of the subsequent tape blocking device 30.

As shown in FIGS. 4A and 4B, the subsequent tape contact part 42a of the probe part 42 of the subsequent tape detection device 40 and the subsequent tape blocking part 32a of the stopper part 32 of the subsequent tape blocking device 30 are arranged in the tape width direction (X-axis direction). The subsequent tape contact part 42a of the probe part 42 of the subsequent tape detection device 40 is positioned on the upstream side of the subsequent tape blocking part 32a of the stopper part 32 of the subsequent tape blocking device 30 in the tape feeding direction A. Therefore, the subsequent carrier tape 200' moving in the tape feeding direction A on the preceding carrier tape 200 can come into contact with the subsequent tape contact part 42a of the probe part 42 of the subsequent tape detection device 40. Subsequently, the subsequent carrier tape 200' can come into contact with the subsequent tape blocking part 32a of the stopper part 32 of the subsequent tape blocking device 30 with the subsequent carrier tape 200' maintaining a contact with the subsequent tape contact part 42a.

The front end 210' of the subsequent carrier tape 200' comes into contact with the subsequent tape contact part 42a of the probe part 42 of the subsequent tape detection device 40 and then comes into contact with the subsequent tape blocking part 32a of the stopper part 32 of the subsequent tape blocking device 30. The probe part 42 thereby swings about the center line of swinging S2 (i.e., rotates in a counterclockwise direction in figures). Consequently, the detective target part 42*b*, provided on the downstream free end side with respect to the center line of swinging S2, moves.

Specifically, in the first embodiment, the probe part 42 is configured such that the detective target part 42*b* on the downstream side of the center line of swinging S2 in the tape feeding direction A moves almost upwardly while the subsequent tape contact part 42*a* on the upstream side of the center line S2 moves downstream due to the contact of the subsequent carrier tape 200'.

The sensor 44 detects the upward movement of the detective target part 42*b* of the probe part 42 caused by the contact of the subsequent tape contact part 42*a* and the front end 210' of the subsequent carrier tape 200'. In the first embodiment, the sensor 44 has a detection area 44*a*, and is configured to detect an object in the detection area 44*a*. As shown in FIGS. 4A and 4B, the detective target part 42*b* is in the detection area 44*a* of the sensor 44 when the subsequent carrier tape 200' does not contact with the subsequent tape contact part 42*a* of the probe part 42. On the other hand, as shown in FIG. 3, the detective target part 42*b* is outside of the detection area 44*a* of the sensor 44 when the subsequent carrier tape 200' contacts with the subsequent tape contact part 42*a* of the probe part 42 and the subsequent tape blocking part 32*a* of the stopper part 32. The sensor 44 thereby can detect the state in which the front end 210' of the subsequent carrier tape 200' contacts with the subsequent tape blocking part 32*a* of the stopper part 32 of the subsequent tape blocking device 30, i.e., the state in which the subsequent carrier tape 200' waits at the subsequent tape standby position Q3.

Preferably, the probe part 42 of the subsequent tape detection device 40 is configured such that a distance between the center line of swinging S2 and the detective target part 42*b* is longer than a distance between the center line of swinging S2 and the subsequent tape contact part 42*a*. Therefore, the resulting displacement of the detective target part 42*b* of the probe part 42 is larger than a displacement of the subsequent tape contact part 42*a* caused by the contact with the subsequent carrier tape 200'. Consequently, the sensor 44 detects the larger movement of the detective target 42*b* and thus can precisely detect a state in which the front end 210' of the subsequent carrier tape 200' contacts with the subsequent tape blocking part 32*a* of the stopper part 32.

As shown in FIGS. 4A and 4B, the subsequent tape detection device 40 has a probe limiting part 46 for limiting a swinging range of the probe part 42, in order to avoid a trouble that the subsequent tape contact part 42 moves upwardly due to a free-swing of the probe part 42 and thereby is not able to contact with the subsequent carrier tape 200' or contacts uncertainly with the subsequent carrier tape 200'. The probe limiting part 46 is provided on the body part 12 of the component supplying apparatus 10, and supports a portion of the probe part 42, which positioned on the downstream side of the center line of swinging S2 in the tape feeding direction A, from below so as to keep the subsequent tape contact part 42*a* at a position at which the subsequent tape contact part 42 *a* can contact with the subsequent carrier tape 200'. The front end 210' of the subsequent carrier tape 200' thereby can certainly come into contact with the subsequent tape contact part 42*a* of the probe part 42.

Again, the subsequent tape blocking device 30 will be described hereinbelow. The locking part 34 of the subsequent tape blocking device 30, as shown in FIGS. 3, 4A, and 4B, is a movable member that removably contacts with the engagement part 32*b* of the swingable stopper part 32 and thus releasably locks the stopper part 32.

In the first embodiment, the movable locking part 34 is configured to swing about the center line of swinging S1 extending in the tape width direction (X-axis direction). That is, the center line of swinging in locking part 34 is coincident with the center line of swinging in stopper part 32 of the subsequent tape blocking device 30. For example, the stopper part 32 and the locking part 34 are supported swingably by a common support pin (not shown). According to the arrangements, an installation space for the stopper part 32 and the locking part 34 is compact, compared to a case in which the stopper part 32 and the locking part 34 are disposed in the body part 12 of the component supplying apparatus 10 such that the center lines thereof are not coincident. Consequently, the component supplying apparatus 10 is downsized.

In the first embodiment, as shown in FIG. 3, the swingable locking part 34 of the subsequent tape blocking device 30 has two free ends. The locking part 34 also has a stopper contact part 34*a* provided on the one free end side and removably contacting with the engagement part 32*b* of the stopper part 32, and a preceding tape contact part 34*b* provided on the other free end side and contacting with the preceding carrier tape 200.

The stopper contact part 34*a* of the locking part 34 functions to enable the preceding carrier tape 200 to pass between the subsequent tape blocking part 32*a* of the stopper part 32 of the subsequent tape blocking device 30 and the lower tape guide surface 12*b* of the tape guiding part 12*d* without being blocked by the subsequent tape blocking part 32*a*.

Specifically, the stopper contact part 34*a* of the locking part 34 comes into contact with the engagement part 32*b* of the stopper part 32, thereby makes the subsequent tape blocking part 32*a* of the stopper part 32 move upwardly and away from the lower tape guide surface 12*b* of the tape guiding part 12*d* (in the first embodiment, an elevating tape guide surface 50*a* formed on an elevating block 50 as described below in detail), and then locks the subsequent tape blocking part 32*a* so that the carrier tape 200 can pass under the subsequent tape blocking part 32*a* in the tape feeding direction A. That is, the subsequent tape blocking part 32*a* waits while facing to and keeping a distance from the lower tape guide surface 12*b* of the tape guiding part 12*d*. Consequently, the preceding carrier tape 200 can pass in the tape feeding direction A between the subsequent tape blocking part 32*a* of the stopper part 32 and the elevating tape guide surface 50*a* of the elevating block 50 without being blocked by the subsequent tape blocking part 32*a*.

Here, the elevating tape guide surface 50*a* will be described. The elevating tape guide surface 50*a* is a part of the lower tape guide surface 12*b* of the tape guiding part 12*d*. The elevating tape guide surface 50*a* also is capable to move upwardly toward the sprocket wheel 14. Specifically, the elevating tape guide surface 50*a* is formed on a upper surface of the elevating block 50 biased toward the sprocket wheel 14 by a spring 52. Therefore, as shown in FIG. 4B, when the subsequent carrier tape 200' is not stacked on the preceding carrier tape 200, the sprocket wheel 14 can feed the preceding carrier tape 200 in the tape feeding direction A since the teeth 14*a* of the sprocket wheel 14 continues to engage with the feed holes 208 of the preceding carrier tape 200. On the other hand, as shown in FIG. 3, when the subsequent carrier tape 200' is stacked on the preceding carrier tape 200, the sprocket wheel 14 can feed the subsequent carrier tape 200' since the teeth 14a of the sprocket wheel 14 continues to engage with the feed holes 208' of the subsequent carrier tape 200'.

As shown in FIGS. 4A and 4B, the stopper contact part 34a of the locking part 34 of the subsequent tape blocking device 30 continues to contact with the engagement part 32b of the stopper part 32 until the preceding carrier tape 200 passes in the tape feeding direction A between the subsequent tape blocking part 32a and the elevating tape guide surface 50a of the tape guiding part 12d (the elevating block 50) and then comes into contact with the preceding tape contact part 34b of the locking part 34.

The preceding tape contact part 34b of the locking part 34, which is in contact with the preceding carrier tape 200, is positioned on the downstream side of the subsequent tape blocking part 32a of the stopper part 32 in the tape feeding direction A. The lower tape guide surface 12b of the tape guiding part 12d under the preceding tape contact part 34b of the locking part 34 has a concave portion 12e in which at least part of the preceding tape contact part 34b of the locking part 34 can enter form above. That is, a portion of the lower tape guide surface 12b under the preceding tape contact part 34b supports at least one side in the tape width direction of the lower surface of the carrier tape 200. The preceding tape contact part 34b of the locking part 34 waits with at least part thereof placed in the concave portion 12e of the lower tape guide surface 12b of the tape guiding part 12d when the stopper contact part 34a of the locking part 34 contacts with the engagement part 32b of the stopper part 32 (when the stopper part 32 is locked by the locking part 34).

FIG. 4C shows the preceding carrier tape 200 having already passed in the tape feeding direction A between the subsequent tape blocking part 32a of the stopper part 32 and the elevating tape guide surface 50a of the tape guiding part 12d (the elevating block 50) and then having just come into contact with the preceding tape contact part 34b of the locking part 34.

The preceding tape contact part 34b of the locking part 34 with at least part thereof placed in the concave portion 12e of the tape guiding part 12d as shown in FIG. 4B comes into contact with the preceding carrier tape 200 moving in tape feeding direction A on the lower tape guide surface 12b of the tape guiding part 12d and then climbs onto the upper surface 200a of the preceding carrier tape 200 as shown in FIG. 4C. In the first embodiment, the preceding tape contact part 34b of the locking part 34 is, for example, a roller 36 free-rotating about a center line of rotation extending in the tape width direction (X-axis direction), in order to be able to climb easily onto the upper surface 200a of the preceding carrier tape 200.

As shown in FIG. 4C, the preceding tape contact part 34b (the roller 36) of the locking part 34 climbs onto the upper surface 200a of the preceding carrier tape 200 fed in the tape feeding direction A and supported by the lower tape guide surface 12b through the lower surface thereof, thereby the locking part 34 swings about the center line of swinging S1 (in figures, rotates in a counterclockwise direction). The stopper contact part 34a of the locking part 34 thereby moves away from the engagement part 32b of the stopper part 32 and moves upwardly. Consequently, the contact of the stopper contact part 34a of the locking part 34 and the engagement part 32b of the stopper part 32 is broken, i.e., the locking part 34 unlocks stopper part 32.

After have been unlocked by the locking part 34, the stopper part 32 swings about the center line of swinging S1 (in figures, rotates in a counterclockwise direction). Therefore, the subsequent tape blocking part 32a moves downwardly toward the upper surface 200a of the preceding carrier tape 200 and then comes into contact with the upper surface 200a thereof.

In the first embodiment, as shown in FIGS. 4A and 4B, the locking part 34 is biased by a spring 38 such that the preceding tape contact part 34b (the roller 36) of the locking part 34 enters into the concave portion 12e formed the lower tape guide surface 12b of the tape guiding part 12d. Instead of the spring 38, the locking part 34 may be configured such that the preceding tape contact part 34b enters into the concave portion 12e of the lower tape guide surface 12b of the tape guiding part 12d by use of the weight of the preceding tape contact part 34b. In the case where the component supplying apparatus 10 is configured to use an carrier tape 200 having embossed component recesses 202 (i.e., having embosses protruding from the lower surface 200b), the concave portion 12e into which the preceding tape contact part 34b of the locking part 34 enters may be a groove which extends in the tape feeding direction and in which the embosses of the carrier tape 200 are movable in the tape feeding direction A.

Figure 4D:
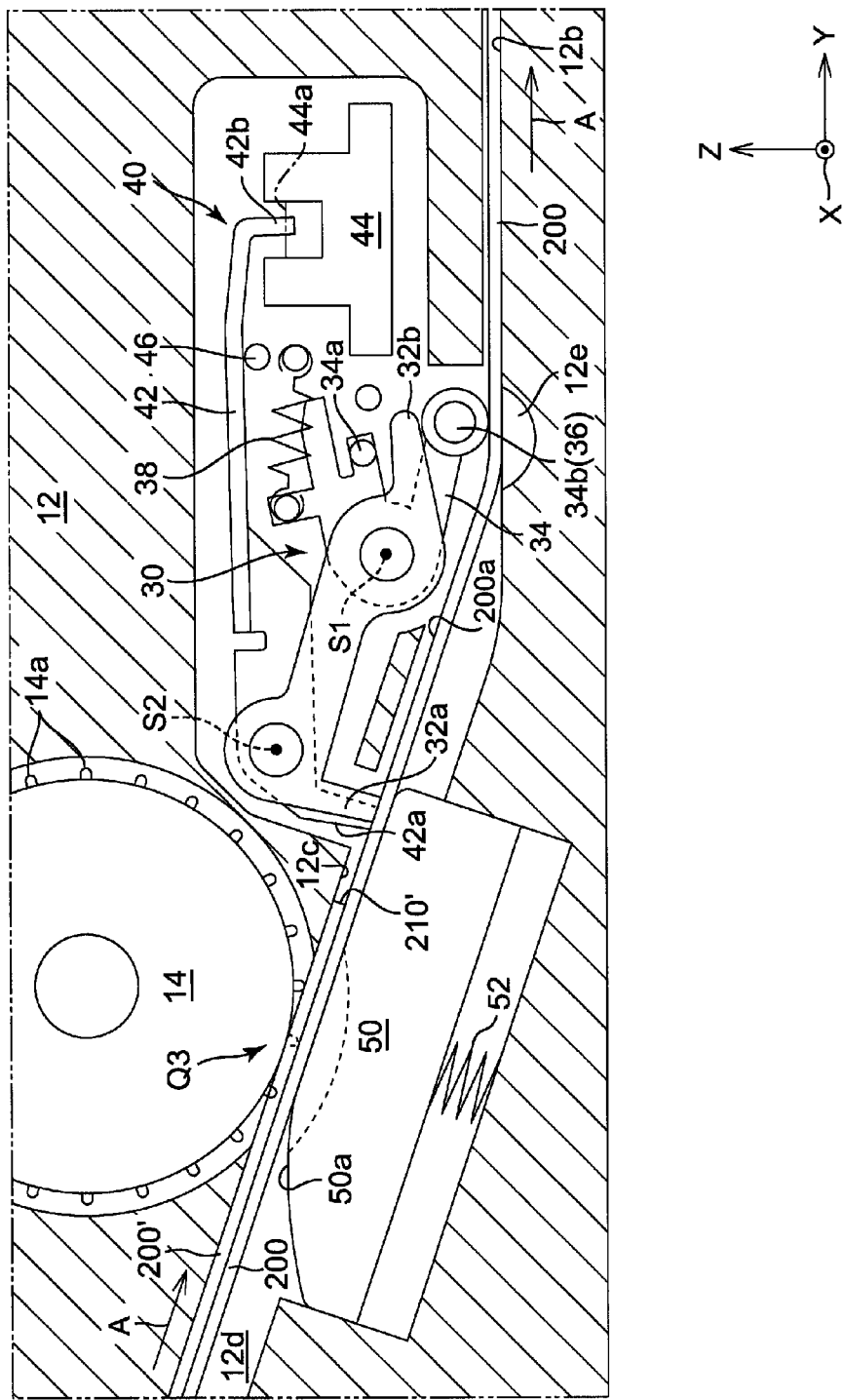
FIG. 4D is a fragmentary enlarged view of the component supplying apparatus in accordance with the first embodiment, including the vicinity of the subsequent tape standby position right before the subsequent carrier tape stacked on the preceding carrier tape waits.

FIG. 4D shows the subsequent carrier tape 200' right before waiting, i.e., after having already been entered into the body part 12 of the component supplying apparatus 10 and right before comes into contact with the subsequent tape blocking part 32a of the stopper part 32 of the subsequent tape blocking device 30 through the front end 200' thereof.

As shown in FIG. 4D, the subsequent carrier tape 200' is fed in the tape feeding direction A between the upper surface 200a of the preceding carrier tape 200 and the upper tape guide surface 12c of the tape guiding part 12d by, for example, hand work of a worker. As shown in FIG. 3, the front end 210' of the subsequent carrier tape 200' comes into contact with the subsequent tape blocking part 32a of the stopper part 32 of the subsequent tape blocking device 30, and then the subsequent carrier tape 200' waits at the subsequent tape standby position Q3.

FIG. 4E shows the rear end 212 of the preceding carrier tape 200 has just passed under the subsequent tape blocking part 32a of the stopper part 32 of the subsequent tape blocking device 30.

As shown in FIG. 4E, since the rear end 212 of the preceding carrier tape 200 have passed under the subsequent tape blocking part 32a of the stopper part 32 of the subsequent tape blocking device 30, the overlap of the preceding carrier tape 200 and the subsequent carrier tape 200' is lost. The subsequent carrier tape 200' thereby is set on the lower tape guide surface 12b of the tape guiding part 12d (the elevating tape guide surface 50a of the elevating block 50). In addition to this, the subsequent tape blocking part 32a of the stopper 32 moves downwardly and then comes into contact with the lower tape guide surface 12b of the tape guiding part 12d (the elevating tape guide surface 50a of the elevating block 50). Consequently, the subsequent tape blocking part 32a of the stopper part 32 blocks the movement in the tape feeding direction A of the subsequent carrier tape 200' set on the lower tape guide surface 12b of the tape guiding part 12d, the subsequent carrier tape 200' thereby continues to wait at the subsequent tape standby position Q3.

Figure 4F:
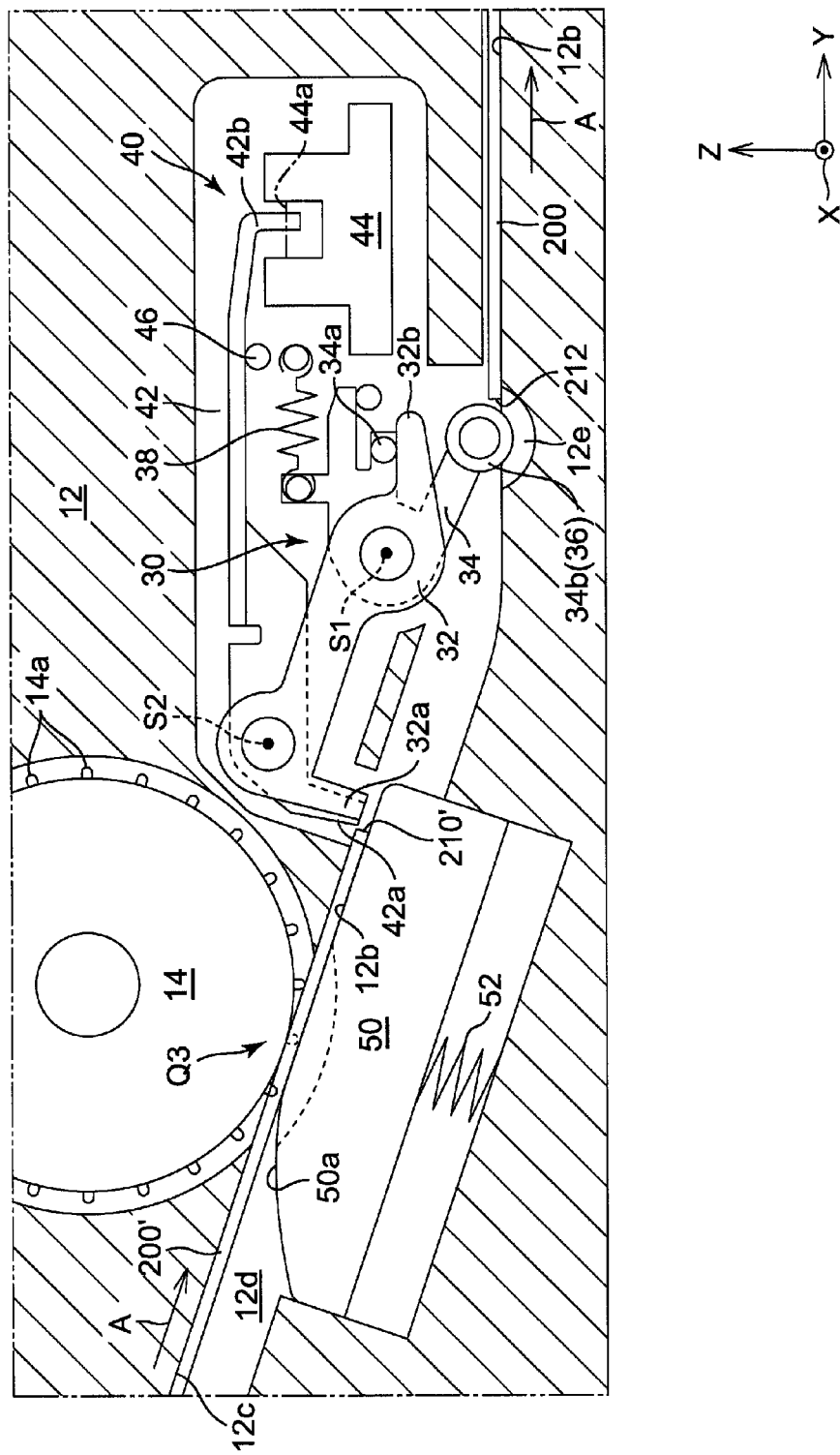
FIG. 4F is a fragmentary enlarged view of the component supplying apparatus in accordance with the first embodiment, including the vicinity of the subsequent tape standby position right after the preceding carrier tape moves away from the preceding tape contact part.

FIG. 4F shows the preceding carrier tape 200 having just moved away from the preceding tape contact part 34b of the locking part 34 of the subsequent tape blocking device 30.

As shown in FIG. 4F, after the contact of the preceding carrier tape 200 and the preceding tape contact part 34b of the locking part 34 of the subsequent tape blocking device 30 have been broken, the locking part 34 swings about the center line of swinging S1 (in figures, rotates in a clockwise direction) such that the preceding tape contact part 34*b* moves downwardly and enters into the concave portion 12*e* of the lower tape guide surface 12*b* of the tape guiding part 12*d*.

Due to the swing of the locking part 34, the stopper contact part 34*a* of the locking part 34 moves downwardly, comes into contact with the engagement part 32*b* of the stopper part 32, and then pushes the engagement part 32*b* downwardly. Therefore, the stopper part 32 swings about the center line of swinging S1 (in figures, rotates in a clockwise direction), the subsequent tape blocking part 32*a* moves upwardly and away from the lower tape guide surface 12*b* of the tape guiding part 12*d* (the elevating tape guide surface 50*a* of the elevating block 50). Consequently, the subsequent carrier tape 200' waiting at the subsequent tape standby position Q3 is permitted to pass in the tape feeding direction A between the subsequent tape blocking part 32*a* of the stopper part 32 and the lower tape guide surface 12*b* of the tape guiding part 12*d*.

As shown in FIG. 1, once a sensor 60 disposed in the tape path P detects the rear end 212 of the preceding carrier tape 200, the subsequent carrier tape 200' waiting at the subsequent tape standby position Q3 begins to be fed automatically in the tape feeding direction A. That is, once the sensor 60 detects the rear end 212 of the preceding carrier tape 200, the sprocket wheel 14 starts to rotate, and then the subsequent carrier tape 200' begins to be fed automatically in the tape feeding direction A.

Hereinbelow, processes from when the preceding carrier tape 200 is entered into the component supplying apparatus 10 to when the subsequent carrier tape 200' entered subsequently begins to be fed automatically will be described.

Firstly, as shown in FIG. 4B, the preceding carrier tape 200 is entered into the component supplying apparatus 10 until the feed holes 208 of the preceding carrier tape 200 have engaged with the teeth 14*a* of the sprocket wheel 14 by, for example, hand work of a worker.

As shown in FIG. 4B, After the feed holes 208 of the preceding carrier tape 200 have engaged with the teeth 14*a* of the sprocket wheel 14, the sprocket wheel 14 starts to rotate automatically or manually. The preceding carrier tape 200 thereby begins to be fed in the tape feeding direction A.

As shown in FIG. 4C, the front end 210 of the preceding carrier tape 200 fed in the tape feeding direction A by the sprocket wheel 14 passes between the subsequent tape blocking part 32*a* of the stopper part 32 of the subsequent tape blocking device 30 and the lower tape guide surface 12*b*. The preceding tape contact part 34*b* (roller 36) of the locking part 34 climbs onto the preceding carrier tape 200 moving in the tape feeding direction A on the lower tape guide surface 12*b*. Therefore, the stopper part 34 is unlocked, the subsequent tape blocking part 32*a* moves downwardly and then comes into contact with the upper surface 200*a* of the preceding carrier tape 200.

As shown in FIG. 1, when the preceding carrier tape 200 fed in the tape feeding direction A have reached at the sprocket wheel 16, the sprocket wheel 14 becomes possible to rotate freely and the sprocket wheel 16 starts to feed the preceding carrier tape 200. After the preceding carrier tape 200 have reached at the sprocket wheel 18, the subsequent carrier tape 200 is fed in the tape feeding direction A by the two sprocket wheels 16 and 18 rotating synchronously.

As shown in FIG. 4D, the subsequent carrier tape 200' is stacked on the preceding carrier tape 200, which fed in the tape feeding direction A by the sprocket wheels 16 and 18, by, for example, hand work of a worker. Also, the subsequent carrier tape 200' is fed in the tape feeding direction A until the front end 210' thereof comes into contact with the subsequent tape blocking part 32*a* of the stopper part 32 of the subsequent tape blocking device 30, as shown in FIG. 3. The subsequent tape detection device 40 detects the contact of the front end 210' of the subsequent carrier tape 200' and the subsequent tape blocking part 32*a* of the stopper part 32 of the subsequent tape blocking device 30. The subsequent carrier tape 200' waits at the subsequent tape standby position Q3 (automatic feeding for the subsequent carrier tape 200' has been prepared).

As shown in FIG. 4E, the rear end 212 of the preceding carrier tape 200, which is fed in the tape feeding direction A by the sprocket wheels 16 and 18, passes between the subsequent tape blocking part 32*a* of the stopper part 32 of the subsequent tape blocking device 30 and the lower tape guide surface 12*b*. Next, the rear end 212 of the preceding carrier tape 200 moving in the tape feeding direction A on the lower tape guide surface 12*b* passes the preceding tape contact part 34*b* (the roller 36). The preceding tape contact part 34*b* climbs down from the preceding carrier tape 200, and thereby the contact of the preceding carrier tape 200 and the preceding tape contact part 34*b* is broken. Therefore, the locking part 34 locks the stopper part 32, the subsequent tape blocking part 32*a* of the stopper part 32 thereby moves upwardly (on the upper tape guide surface 12*c* side) and then waits. Consequently, the subsequent carrier tape 200' waiting at the subsequent tape standby position Q3 is permitted to pass in the tape feeding direction A between the subsequent tape blocking part 32*a* and the lower tape guide surface 12*b* of the tape guiding part 12*d* (the elevating tape guide surface 50*a* of the elevating block 50).

After the rear end 212 of the preceding carrier tape 200, which fed in the tape feeding direction A by the sprocket wheels 16 and 18, is detected by the sensor 60 shown in FIG. 1, the sprocket wheel 14 starts to rotate so as to feed the subsequent carrier tape 200'.

Thus, the plurality of carrier tapes 200 is serially-fed in the tape feeding direction A in this way.

Also, the sensor 60 may be configured to detect the front end 210' of the subsequent carrier tape 200' after the elapse of a given period of time since the sensor 60 has detected the rear end 212 of the preceding carrier tape 200. In this case, the sensor 60 can detect a tape feeding error occurred by the reason that the subsequent carrier tape 200' is not fed normally in the tape feeding direction A from the subsequent tape standby position Q3, when the sensor 60 fails to detect the front end 210' of the subsequent carrier tape 200' after the elapse of the given period of time since the sensor 60 has detected the rear end 212 of the preceding carrier tape 200.

According to the first embodiment, the plurality of carrier tapes 200 are reliably serially-fed regardless of the carrier tape thicknesses. This will be described below in detail.

As shown in FIGS. 4A and 4B, at least part of the preceding tape contact part 34*b* of locking part 34 of the subsequent tape blocking device 30 is placed in the concave portion 12*e* formed on the lower tape guide surface 12*b* of the tape guiding part 12*d*, when not contacting with the preceding carrier tape 200. In addition to this, as shown in FIG. 3, the subsequent tape contact part 34*b* of the locking part 34 is configured to come into contact with the preceding carrier tape 200 moving in the tape feeding direction A on the lower tape guide surface 12*b* and then to climb onto the upper surface 200*a* thereof. Therefore, the preceding tape contact part 34*b* can move a longer distance than the thickness of the carrier tape 200. That is, the locking part 34 can move a longer than the thickness of the carrier tape 200. The stopper contact part 34*a* thereby can move a longer distance than the thickness of the carrier tape 200 away from the engagement part 32b of the stopper part 32.

Specifically, as shown in FIGS. 4B and 4F, the stopper contact part 34a of the locking part 34 can move a longer distance than the thickness of the carrier tape 200 away from the engagement part 32b of the stopper part 32, when the subsequent tape blocking part 32a of the stopper part 32 keeps a distance from the lower tape guide surface 12b of the tape guiding part 12d (the elevating tape guide surface 50a of the elevating block 50) so as to enable to the preceding and subsequent carrier tapes 200, 200' pass through therebetween.

As shown in FIGS. 4C-4E, the stopper contact part 34a of the locking part 34 move the longer distance than the thickness of the carrier tape 200 away from the engagement part 32b of the stopper part 32, thereby the contact of the stopper contact part 34a of the locking part 34 and the engagement part 32b of the stopper part 32 is broken. Consequently, the stopper part 32 can swing freely and separately without relation to the locking part 34.

Therefore, the subsequent tape blocking part 32a of the stopper part 32, as shown in FIGS. 4C and 4E, can move downwardly toward and come into contact with the preceding carrier tape 200 or the lower tape guide surface 12b of the tape guiding part 12d (the elevating tape guide surface 50a of the elevating block 50) by use of the weight thereof. That is, regardless of the thickness of the preceding carrier tape 200 contacted with the preceding tape contact part 34b of the locking part 34, the subsequent tape blocking part 32a of the stopper part 32 can come into contact with the preceding carrier tape 200 or the lower tape guide surface 12b of the tape guiding part 12d (the elevating tape guide surface 50a of the elevating block 50) by use of the weight thereof. Consequently, the subsequent tape blocking part 32a can certainly keep a thin subsequent carrier tape 200' waiting (it is suppressed that the thin subsequent carrier tape 200' passes in the tape feeding direction A between the subsequent tape blocking part 32a and the preceding carrier tape 200 during blocking to the subsequent carrier tape 200' by the stopper part 32).

By such reasons, the plurality of carrier tapes 200 are reliably serially-fed regardless of the carrier tape thicknesses.

Second Embodiment

Figure 5:
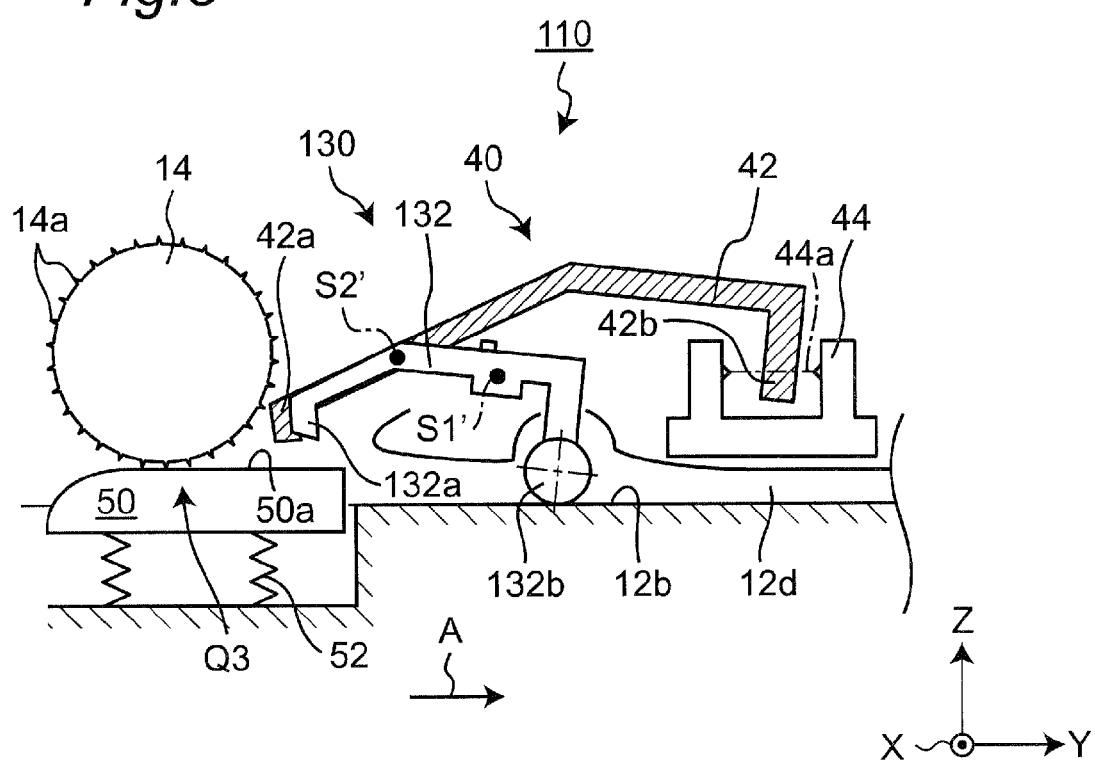
FIG. 5 is a fragmentary enlarged view showing a schematic configuration of a component supplying apparatus in accordance with a second embodiment of the invention; including a vicinity of a subsequent tape standby position.

FIG. 5 schematically shows a part of a component supplying apparatus in accordance with a second embodiment. The component supplying apparatus 110 of the second embodiment and the component supplying apparatus 10 are different in the configuration of the subsequent tape blocking device for keeping the subsequent carrier tape waiting. Therefore, the subsequent tape blocking device of the component supplying apparatus 110 in accordance with the second embodiment will be mainly described below. Referential signs of Elements of the second embodiment are same as referential signs of identical or similar elements of the first embodiment.

The subsequent tape blocking device 30 of the first embodiment described above, as shown in FIG. 3, has the stopper part 32 and the locking part 34. Also, the stopper part 32 has the subsequent tape blocking part 32a, and the locking part 34 has the preceding tape contact part 34b.

On the other hand, the subsequent tape blocking device 130 of the second embodiment, as shown in FIG. 5, a lever part 132. The lever part 132 has a subsequent tape blocking part 132a and a preceding tape contact part 132b.

In the second embodiment, the lever part 132 of the subsequent tape blocking device 130 is a swingable member swings freely about a center line of swinging S1' extending in the tape width direction of the carrier tape 200 (X-axis direction). The lever part 132 also has free ends on upstream and downstream sides of the center line of swinging S1' in the tape feeding direction A.

The subsequent tape blocking part 132a is provided on the upstream free end side of the lever part 132. The preceding tape contact part 132b is provided on the downstream free end side of the lever part 132. In the second embodiment, the preceding tape contact part 132b of the lever part 132 comes into contact with the lower tape guide surface 12b of the tape guiding part 12d.

In the second embodiment, the probe part 42 of the subsequent tape detection device 40 is supported swingably by the lever part 132 and swing about a center line of swinging S2' provided on the upstream free end side of the lever part 132 and extending in the tape width direction (X-axis direction).

Hereinbelow, automatic feeding for the subsequent carrier tape 200' in the component supplying apparatus 110 in accordance with the second embodiment will be described with reference to FIGS. 6A-6D.

Figure 6A:
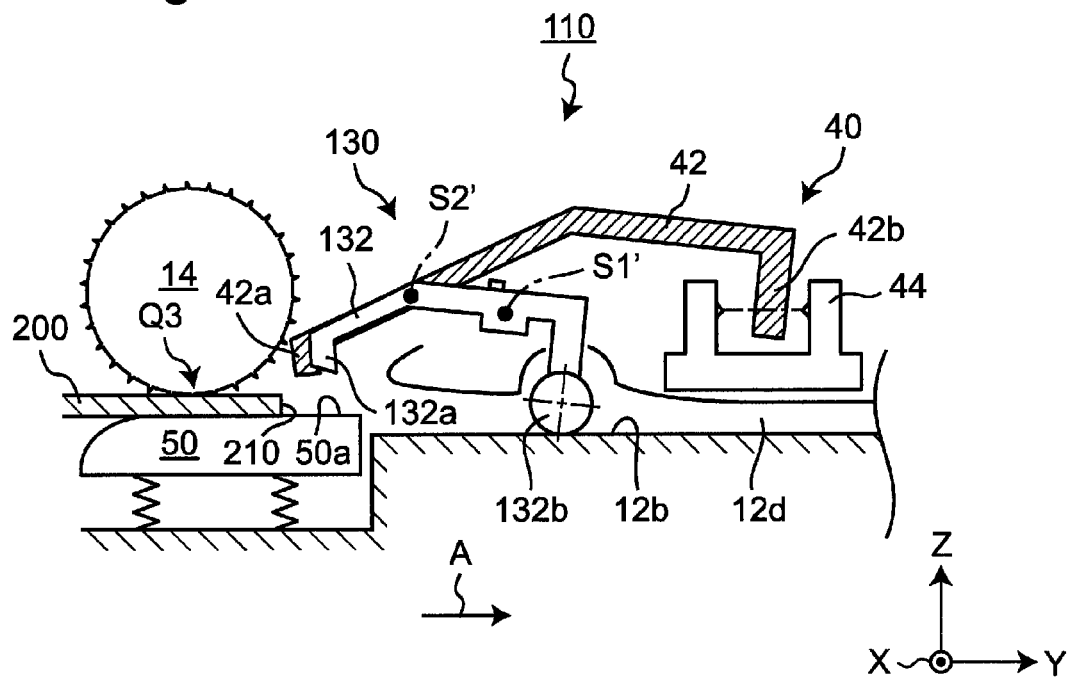
FIG. 6A is a fragmentary enlarged view of the component supplying apparatus in accordance with the second embodiment, including the vicinity of the subsequent tape standby position right before a front end of a preceding carrier tape passes under a subsequent tape blocking part of a lever part of a subsequent tape blocking device.

FIG. 6A shows the preceding carrier tape 200 having just been entered into the component supplying apparatus 110. Specifically, FIG. 6A shows the vicinity of the subsequent tape standby position Q3 right before the front end 210 of the preceding carrier tape 200 passes under the subsequent tape blocking part 132a of the lever part 132 of the subsequent tape blocking device 130.

As shown in FIG. 6A, the subsequent tape blocking part 132a of the lever part 132 of the subsequent tape blocking device 130 faces to and keeps a distance from the lower tape guide surface 12b of the tape guiding part 12d (in the second embodiment, the elevating tape guide surface 50a of the elevating block 50), and thus waits. On the other hand, the preceding tape contact part 132b of the lever part 132 contacts with the lower tape guide surface 12b of the tape guiding part 12d on the downstream side of the subsequent tape blocking part 132a in the tape feeding direction A.

The preceding carrier tape 200 passes in the tape feeding direction A under the subsequent tape blocking part 132a of the lever part 132 of the subsequent tape blocking device 130, and then comes into contact with the preceding tape contact part 132b of the lever part 132 through the front end 210 thereof. Consequently, the preceding tape contact part 132b climbs onto the upper surface 200a of the preceding carrier tape 200 moving in the tape feeding direction A.

Figure 6B:
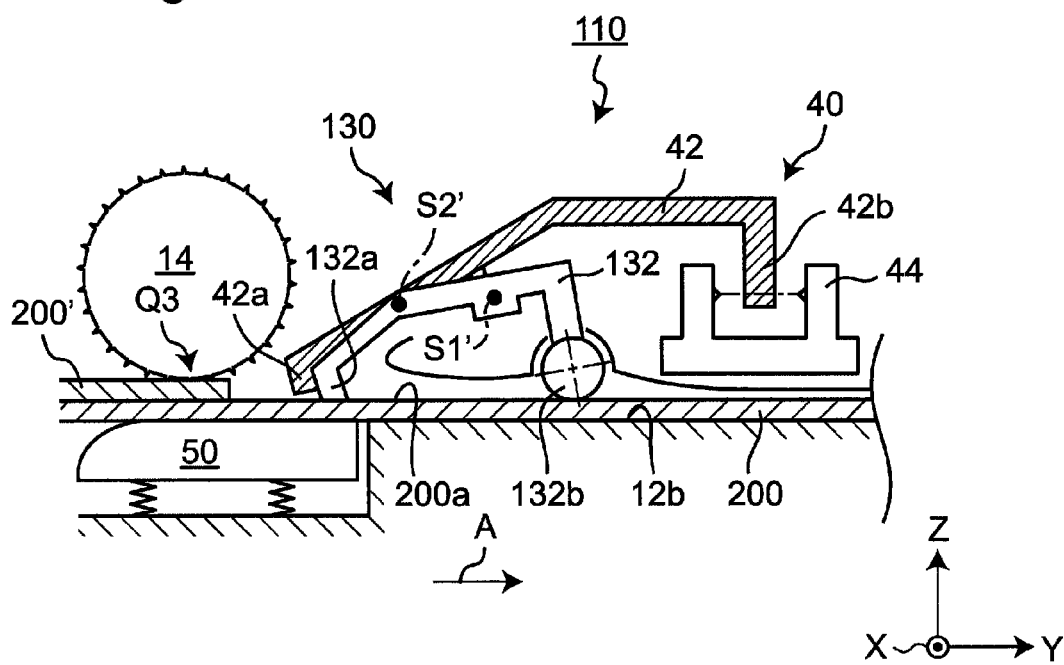
FIG. 6B is a fragmentary enlarged view of the component supplying apparatus in accordance with the second embodiment, including the vicinity of the subsequent tape standby position right before the subsequent carrier tape stacked on the preceding carrier tape waits.

Because the preceding tape contact part 132b climbs onto the upper surface 200a of the preceding carrier tape 200, the lever part 132 swings about the center line of swinging S1' (in figures, rotates in a counterclockwise direction). Due to the swinging of the lever part 132, the subsequent tape blocking part 132a moves downwardly from the waiting position toward the upper surface 200a of the preceding carrier tape 200. As shown in FIG. 6B, the subsequent tape blocking part 132a thereby comes into contact with the upper surface 200a of the preceding carrier tape 200 moving in the tape feeding direction A.

Figure 6C:
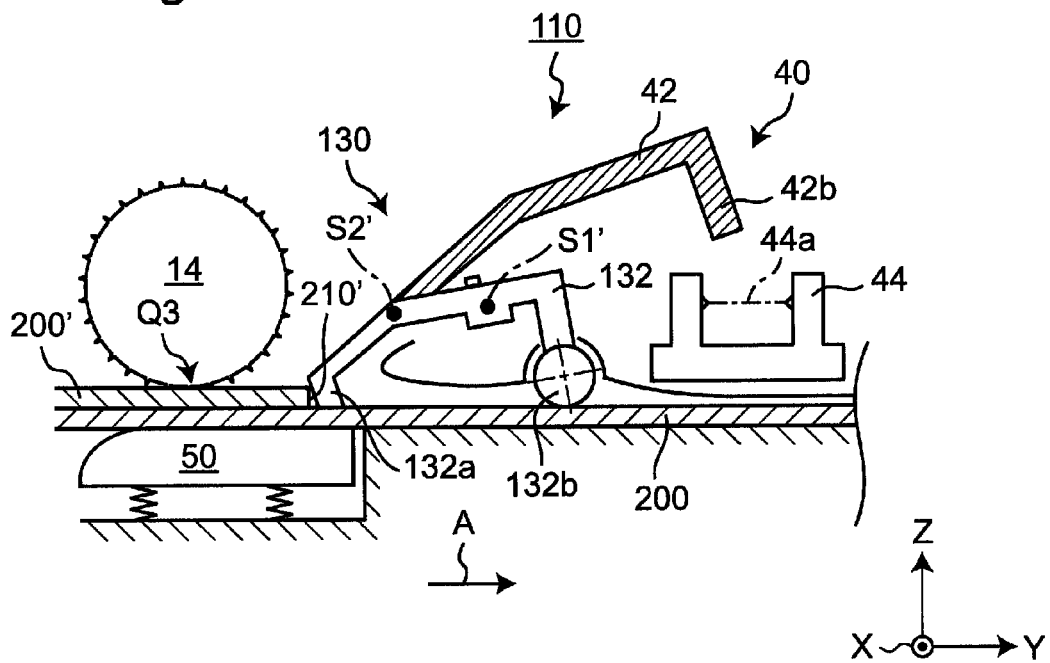
FIG. 6C is a fragmentary enlarged view of the component supplying apparatus in accordance with the second embodiment, including the vicinity of is the subsequent tape standby position, and showing a front end of the subsequent carrier tape contacting with the subsequent tape blocking part of the lever part of the subsequent tape blocking device.

As shown in FIG. 6B, the subsequent carrier tape 200' is fed in tape feeding direction A on the preceding carrier tape 200. Then, as shown in FIG. 6C, the front end 210' of the subsequent carrier tape 200' comes into contact with the subsequent tape blocking part 132a of the lever part 132 of the subsequent tape blocking device 130. The subsequent carrier tape 200' thereby waits at the subsequent tape standby position Q3.

The front end 210' of the subsequent carrier tape 200' comes into contact with the subsequent tape contact part 42*a* of the probe part 42 of the subsequent tape detection device 40 before coming into contact with the subsequent tape blocking part 132*a*. The probe part 42 thereby swings about the center line of swinging S2', the detective target part 42*b* moves outside of the detection area 44*a* of the sensor 44. Consequently, the sensor 44 detects the subsequent carrier tape 200' contacting with the subsequent tape blocking part 132*a*, i.e., the subsequent carrier tape 200' waiting at the subsequent tape standby position Q3.

Figure 6D:
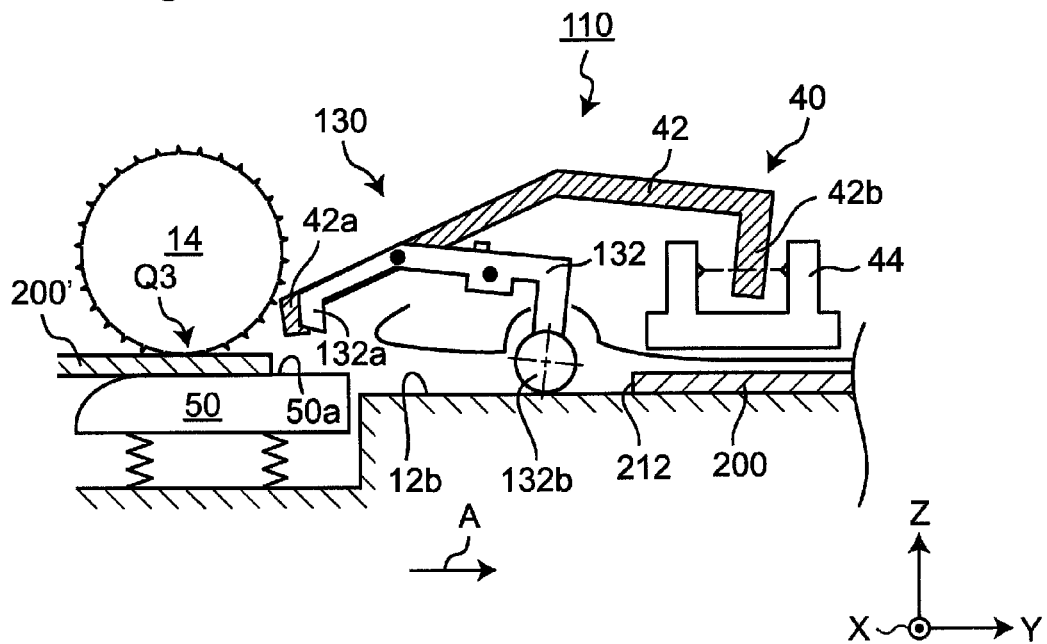
FIG. 6D is a fragmentary enlarged view of the component supplying apparatus in accordance with the second embodiment, including the vicinity of the subsequent tape standby position right after the preceding carrier tape moves away from a preceding tape contact part of the lever part of the subsequent tape blocking device.

As shown in FIG. 6D, the preceding tape contact part 132*b* of the lever part 132 of the subsequent tape blocking device 130 climbs down from the upper surface 200*a* of the preceding carrier tape 200 moving in the tape feeding direction A, and thereby the lever part 132 about the center line of swinging S1' (in figures, rotates in a clockwise direction). Therefore, the subsequent tape blocking part 132*a* moves upwardly, and the preceding tape contact part 132*b* comes into contact with the lower tape guide surface 12*b* of the tape guiding part 12*d*. Consequently, the subsequent carrier tape 200' is permitted to pass between the subsequent tape blocking part 132*a* and the lower tape guide surface 12*b* of the tape guiding part 12*d* (in the second embodiment, the elevating tape guide surface 50*a* of the elevating block 50).

According to the second embodiment, the plurality of carrier tapes 200 are reliably serially-fed regardless of the carrier tape thicknesses, as well as the first embodiment.

In the second embodiment, the subsequent tape blocking part 132*a* and the preceding tape contact part 132*b* are provided on the common lever part 130. Therefore, the subsequent tape blocking device 130 of the second embodiment is a simpler in configuration than the device 30 of the first embodiment since the subsequent tape blocking part 32*a* is provided on the stopper part 32 and the preceding tape contact part 34*b* is provided on the locking part 34 in the first embodiment.

In the case where the subsequent carrier tape 200' is very thinner that the preceding carrier tape 200, the component supplying apparatus 10 of the first embodiment is preferable to the component supplying apparatus 110 of the second embodiment.

In the first embodiment, it is more difficult for the thin subsequent carrier tape 200' to pass between the subsequent tape blocking part 32*a* and the preceding carrier tape 200 since the subsequent tape blocking part 32*a* certainly continues to contact with the upper surface 200*a* of the preceding carrier tape 200 by use of the weight thereof, as shown in FIG. 4D.

Though the invention has been described with reference to the above embodiments, the invention is not limited to the embodiments.

For example, in the first embodiment, as shown in FIG. 3, the locking part 34 of the subsequent tape blocking device 30 is the member swinging about the center line of swinging S1. The locking part of embodiments in accordance with the invention is not limited to the locking part 34.

Figure 7A:
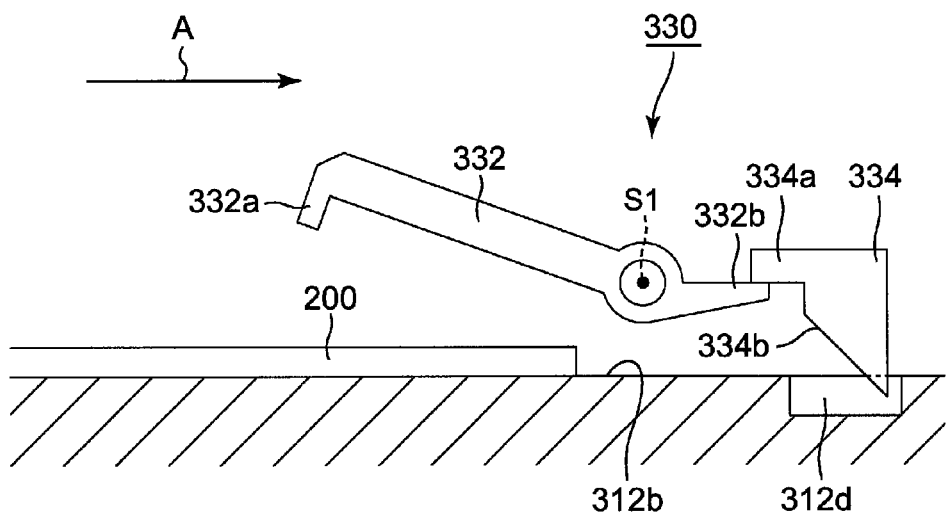
FIG. 7A is a schematic view of a subsequent tape blocking device of a component supplying apparatus in accordance with an another embodiment before a preceding tape contact part comes into contact with a preceding carrier tape.
Figure 7B:
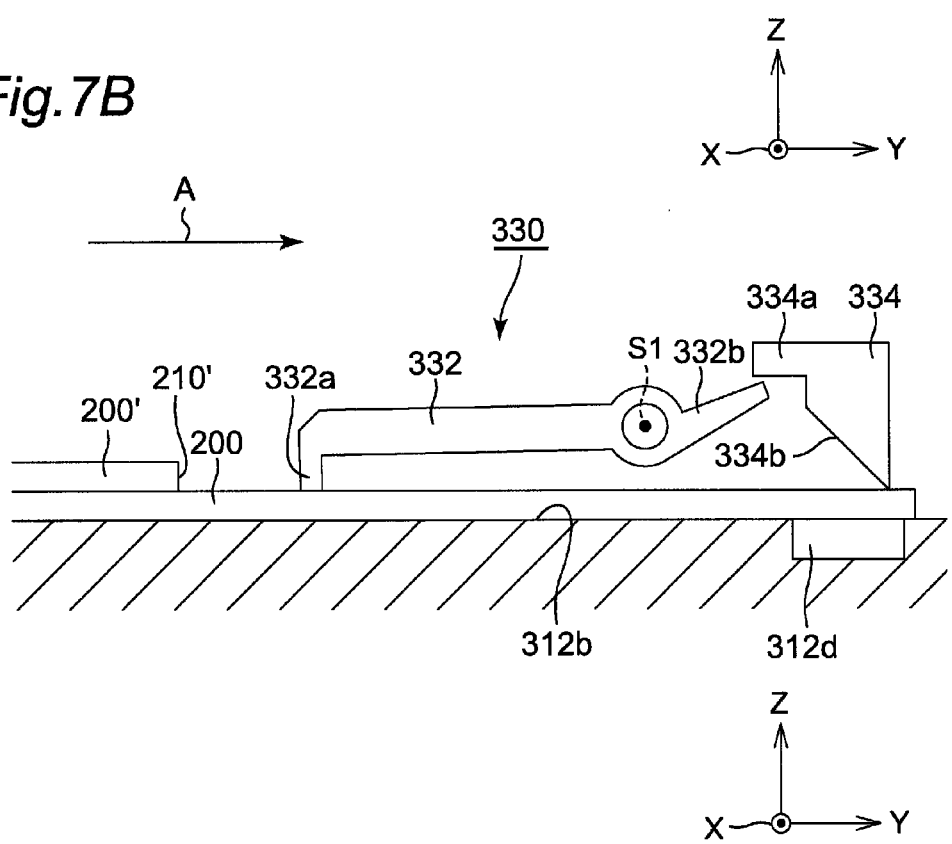
FIG. 7B is a schematic view of the subsequent tape blocking device of the component supplying apparatus in accordance with the another embodiment after the preceding tape contact part comes into contact with the preceding carrier tape.

For example, FIGS. 7A and 7B schematically show a subsequent tape blocking device 330 of a component supplying apparatus in accordance with an another embodiment of the invention.

As shown in FIG. 7A, the subsequent tape blocking device 330 has a stopper part 332 capable to swing about a center line of swinging S1 extending in the tape width direction (X-axis direction) of the carrier tape 200, and a locking part 334 movable in the tape thickness direction (Z-axis direction) of the carrier tape 200.

The stopper part 332 of the subsequent tape blocking device 330 has free ends on the upstream and downstream sides of the center line of swinging in the tape feeding direction A. The stopper part 330 also has a subsequent tape blocking part 332*a* provided on the upstream free end side and coming into contact with the front end 210' of the subsequent carrier tape 200' moving in the tape feeding direction A on the preceding carrier tape 200, and an engagement part 332*b* provided on the downstream free end side.

The locking part 334 of the subsequent tape blocking device 330 has a stopper part 334*a* keeping the subsequent tape blocking part 332*a* waiting above the tape guide surface 312*b* so as to enable the carrier tape 200 to pass between the subsequent tape blocking part 332*a* and the tape guide surface 312*b* by coming into contact with the engagement part 332*b* of the stopper part 332 from at least above, and a preceding tape contact part 334*b* capable to climb onto the upper surface of the preceding carrier tape 200 having passed in the tape feeding direction A between the subsequent tape blocking part 332*a* and the tape guide surface 312*b*.

The preceding tape contact part 334*b* of the locking part 334 of the subsequent tape blocking device 330 has a tilted surface in which the downstream part thereof in the tape feeding direction A is lower than the upstream part thereof.

As shown in FIG. 7A, at least part of the preceding tape contact part 334*b* of the locking part 334 is placed in a concave portion 312*d* formed on the tape guide surface 312*b*. The preceding carrier tape 200 moving in the tape feeding direction A on the tape guide surface 312*b* comes into contact with the preceding tape contact part 334*b*, then the locking part 334 moves upwardly, and thereby the preceding tape contact part 334*b* climbs onto the upper surface of the preceding carrier tape 200. Therefore, the locking part 334 unlocks the stopper part 332, the subsequent tape blocking part 332*a* of the stopper part 332 moves downwardly toward and then comes into contact with the preceding carrier tape 200, as shown in FIG. 7B.

As described above, the locking part of the subsequent tape blocking device used in the component supplying apparatus in accordance with embodiments of the invention can climb onto the upper surface of the preceding carrier tape by coming into contact with the preceding carrier tape and can take various forms therefor.

In the component supplying apparatus 10 of the first embodiment as described above, as shown in FIG. 3, the lower tape guide surface 12*b* of the tape guiding part 12*d* facing the lower surface 200*a* of the carrier tape 200 is a surface extending continuously in the tape feeding direction A in essence. In the component supplying apparatus of the first embodiment, the tape guide surface 12*b* of the tape guiding part 12*d* extends continuously in essence and guides the carrier tape 200 so as to enable the tape 200 to move in the tape feeding direction A, although the tape guide surface 12*b* has a discontinuity since the elevating tape guide surface 50*a* of the elevating block 50 is a part of the tape guide surface 12*b* of the tape guiding part 12*d*.

For example, as shown in FIG. 8, a tape guide surface 312*b* for guiding the carrier tape 200 may be formed by arranging in the tape feeding direction A a plurality of rollers 350 rotatable about a rotation center line extending in the tape width direction (X-direction), The carrier tape 200 moves in the tape feeding direction A on the rollers 350. In this case, a portion of the preceding tape contact part 334b of the locking part 334 of the subsequent tape blocking device 330 is placed between the rollers 350 neighboring each other.

Also, in the component supplying apparatus 10 of the first embodiment as described above, as shown in FIG. 4C, after the contact of the stopper contact part 34a of the locking part 34 and the engagement part 32b of the stopper part 32 has been broken, the subsequent tape blocking part 32a of the stopper part 32 of the subsequent tape blocking device 30 moves downwardly toward the preceding carrier tape 200 by use of the weight thereof. Instead of the weight, the subsequent tape blocking part 32a may be biased toward the preceding carrier tape 200 (i.e., the lower tape guide surface 12b of the tape guiding part 12d) by, for example, a biasing member such as a spring.

Also, in the component supplying apparatus 110 of the second embodiment, the lower surface 12b of the tape guiding part 12d may have a concave portion in which at least part of the preceding tape contact part 132b of the lever part 132 of the subsequent tape blocking device 130 is placed, as well as the first embodiment.

Although the present invention has been fully described in connection with the preferred embodiments thereof with reference to the accompanying drawings, it is to be noted that various changes and modifications are apparent to those skilled in the art. Such Changes and modifications are to be understood as included within the scope of the present invention as defined by the appended claims unless they depart therefrom.

In a broad sense, the component supplying apparatus in the accordance with embodiments of the invention is a component supplying apparatus for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying apparatus comprising:

a tape guiding part having a tape guide surface facing a lower surface of the carrier tape and guiding the carrier tape so as to make the carrier tape move along a tape path, a preceding tape contact part capable to climb onto a upper surface of the preceding carrier tape by coming into contact with the preceding tape moving in the tape feeding direction along the tape guide surface of the tape guiding part, and a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part is climbed onto the upper surface of the preceding carrier tape, and to move upwardly from the preceding carrier tape toward the waiting position when the preceding tape contact part is climbed down from the upper surface of the preceding carrier tape, wherein the subsequent tape blocking part keeps the subsequent carrier tape waiting by contacting a front end of the subsequent carrier tape stacked on the preceding carrier tape onto which the preceding tape contact part climbs.

The invention can be applied to any component supplying apparatus as long as the apparatus supplies components with use of a carrier tape.

The invention claimed is:

1. A component supplying apparatus for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying apparatus comprising:

a tape guiding part having a tape guide surface facing a lower surface of the carrier tape and guiding the carrier tape so as to make the carrier tape move along a tape path, a preceding tape contact part capable to climb onto an upper surface of the preceding carrier tape by coming into contact with the preceding tape moving in the tape feeding direction along the tape guide surface of the tape guiding part, a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part has climbed onto the upper surface of the preceding carrier tape, and to move upwardly from the preceding carrier tape toward the waiting position when the preceding tape contact part has climbed down from the upper surface of the preceding carrier tape, a swingable stopper part having free ends positioned upstream and downstream sides of a swinging center thereof in the tape feeding direction, and further having the subsequent tape blocking part on the upstream free end side, and a movable locking part having the preceding tape contact part and a stopper contact part locking the subsequent tape blocking part of the stopper part at the waiting position by coming into contact with the downstream free end side of the stopper part from at least above, wherein the locking part is configured to move by the climbing of the preceding tape contact part of the locking part onto the upper surface of the preceding carrier tape moving in the tape feeding direction, so that the stopper contact part of the locking part moves away from the stopper part so as to unlock the subsequent tape blocking part of the stopper part and, consequently, the stopper part swings until the subsequent tape blocking part thereof comes into contact with the upper surface of the preceding carrier tape, and wherein the subsequent tape blocking part is configured to keep the subsequent carrier tape waiting by contacting a front end of the subsequent carrier tape stacked on the preceding carrier tape while the preceding tape contact part is on the preceding carrier tape.

2. The component supplying apparatus according to claim 1, wherein the stopper part is configured such that the subsequent tape blocking part thereof moves downwardly by use of the weight thereof toward the upper surface of the preceding carrier tape when the stopper contact part of the locking part moves away from the stopper part.

3. The component supplying apparatus according to claim 1, wherein the locking part is configured to swing and has two free ends, the stopper contact part is provided on the one free end side, and the preceding tape contact part is provided on the other free end.

4. The component supplying apparatus according to claim 3, wherein the swinging center of the stopper part is coincident with a swinging center of the locking part.

5. A component supplying apparatus for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying apparatus comprising:
   a tape guiding part having a tape guide surface facing a lower surface of the carrier tape and guiding the carrier tape so as to make the carrier tape move along a tape path,
   a preceding tape contact part capable to climb onto an upper surface of the preceding carrier tape by coming into contact with the preceding tape moving in the tape feeding direction along the tape guide surface of the tape guiding part,
   a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part has climbed onto the upper surface of the preceding carrier tape, and to move upwardly from the preceding carrier tape toward the waiting position when the preceding tape contact part has climbed down from the upper surface of the preceding carrier tape, and
   a swingable lever part having free ends positioned upstream and downstream sides of a swinging center thereof in the tape feeding direction, the subsequent tape blocking part being on the upstream free end side, and having the preceding tape contact part on the downstream free end side,
   wherein the subsequent tape blocking part is configured to keep the subsequent carrier tape waiting by contacting a front end of the subsequent carrier tape stacked on the preceding carrier tape while the preceding tape contact part is on the preceding carrier tape.

6. A component supplying apparatus for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying apparatus comprising:
   a tape guiding part having a tape guide surface facing a lower surface of the carrier tape and guiding the carrier tape so as to make the carrier tape move along a tape path,
   a preceding tape contact part capable to climb onto an upper surface of the preceding carrier tape by coming into contact with the preceding tape moving in the tape feeding direction along the tape guide surface of the tape guiding part, and
   a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part has climbed onto the upper surface of the preceding carrier tape, and to move upwardly from the preceding carrier tape toward the waiting position when the preceding tape contact part has climbed down from the upper surface of the preceding carrier tape,
   wherein the subsequent tape blocking part is configured to keep the subsequent carrier tape waiting by contacting a front end of the subsequent carrier tape stacked on the preceding carrier tape while the preceding tape contact part is on the preceding carrier tape,
   wherein the tape guide surface of the tape guiding part has a concave portion in which at least part of the preceding tape contact part enters from above, and
   wherein the preceding tape contact part is configured to climb onto the upper surface of the preceding carrier tape moving in tape feeding direction along the tape guide surface of the tape guiding part from the concave portion of the tape guide surface thereof.

7. The component supplying apparatus according to claim 6, wherein the carrier tape has embossed parts protruding from the lower surface, and
   the concave portion of the tape guiding part is a groove which extends in the tape feeding direction and in which the embossed parts of the carrier tape are movable.

8. A component supplying apparatus for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying apparatus comprising:
   a tape guiding part having a tape guide surface facing a lower surface of the carrier tape and guiding the carrier tape so as to make the carrier tape move along a tape path,
   a preceding tape contact part capable to climb onto an upper surface of the preceding carrier tape by coming into contact with the preceding tape moving in the tape feeding direction along the tape guide surface of the tape guiding part,
   a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part has climbed onto the upper surface of the preceding carrier tape, and to move upwardly from the preceding carrier tape toward the waiting position when the preceding tape contact part has climbed down from the upper surface of the preceding carrier tape, and
   a subsequent tape detection part detecting the subsequent carrier tape with a front end thereof in the tape feeding direction contacted with the subsequent tape blocking part, the subsequent tape detection part comprising a swingable probe part and a sensor,
   wherein the probe part has free ends positioned on upstream and downstream sides of a swinging center thereof in the tape feeding direction, and further has a subsequent tape contact part provided on the upstream free end side and a detective target part provided on the downstream free end side, wherein the subsequent tape contact part is configured to come into contact with the front end of the subsequent carrier tape moving in the tape feeding direction on the preceding carrier tape before the subsequent tape blocking part comes into contact with the subsequent carrier tape, wherein the sensor is configured to detect movements of the detective target part of the probe part, and wherein the subsequent tape blocking part is configured to keep the subsequent carrier tape waiting by contacting a front end of the subsequent carrier tape stacked on the preceding carrier tape while the preceding tape contact part is on the preceding carrier tape.

9. The component supplying apparatus according to claim 8, wherein the probe part of the subsequent tape detection part is configured such that a distance between the swinging center of the probe part and the detective target part is longer than a distance between the swinging center and the subsequent tape contact part.

10. A component supplying method for serially-feeding a plurality of carrier tapes accommodating components in a tape feeding direction which is a tape longitudinal direction, and for keeping a subsequent carrier tape waiting with the subsequent carrier tape stacked on a preceding carrier tape, the component supplying method comprising:

preparing:
- a tape guiding part having a tape guide surface facing a lower surface of the carrier tape and guiding the carrier tape so as to make the carrier tape move along a tape path,
- a preceding tape contact part configured to climb onto a upper surface of the preceding carrier tape by coming into contact with the preceding tape moving in the tape feeding direction along the tape guide surface of the tape guiding part, and
- a subsequent tape blocking part configured to wait on the upstream side of the preceding tape contact part in the tape feeding direction while facing to and keeping a distance from the tape guide surface of the tape guiding part so as to enable the carrier tape to pass between the subsequent tape blocking part and the tape guiding part, to move downwardly from the waiting position toward the upper surface of the preceding carrier tape when the preceding tape contact part has climbed onto the upper surface of the preceding carrier tape, and to move upwardly from the preceding carrier tape toward the waiting position when the preceding tape contact part has climbed down from the upper surface of the preceding carrier tape, feeding the preceding carrier tape in the tape feeding direction along the tape guide surface such that the preceding tape contact part climbs onto the upper surface of the preceding carrier tape and thereby the subsequent tape blocking part moves downwardly toward the upper surface of the preceding carrier tape, and feeding the subsequent carrier tape in the tape feeding direction along the upper surface of the preceding carrier tape onto which the preceding tape contact part has climbed until a front end of the subsequent carrier tape comes into contact with the subsequent tape blocking part on the preceding carrier tape.

* * * * *